United States Patent [19]

Garg et al.

[11] Patent Number: 5,160,544
[45] Date of Patent: Nov. 3, 1992

[54] HOT FILAMENT CHEMICAL VAPOR DEPOSITION REACTOR

[75] Inventors: Diwakar Garg, Macungie, Pa.; Wilman Tsai, Cupertino, Calif.; Robert L. Iampietro, Emmaus, Pa.; Fred M. Kimock, Macungie, Pa.; C. Michael Kelly, Berwyn, Pa.

[73] Assignee: Diamonex Incorporated, Allentown, Pa.

[21] Appl. No.: 578,734

[22] Filed: Sep. 6, 1990

Related U.S. Application Data

[63] Continuation-in-part of Ser. No. 497,159, Mar. 20, 1990, abandoned.

[51] Int. Cl.[5] .................. C23C 16/44; C23C 16/48
[52] U.S. Cl. .................................. 118/724; 118/725; 118/728
[58] Field of Search ............... 118/725, 715, 724, 728

[56] References Cited

FOREIGN PATENT DOCUMENTS 58-190030  11/1983  Japan.
59-21026   2/1984   Japan.
59-43861   3/1984   Japan.

OTHER PUBLICATIONS

Spear, J. Am. Ceram. Soc. 72(2), 171-91 (1989).

*Primary Examiner*—Richard Bueker
*Attorney, Agent, or Firm*—McCubbrey, Bartels, Meyer & Ward

[57] ABSTRACT

An improved hot filament chemical vapor deposition (HFCVD) reactor is disclosed comprising a gas dispersion system, a filament network and an apertured support plate for the substrate. The apertures in the support plate provide for counteracting the natural pressure and temperature gradients which arise within the reactor so that a uniform deposit or material can be coated over the entire surface of multiple small pieces simultaneously. Specifically, the apertured support plate substantially reduces the extent of radial (stagnation point) gas flow adjacent to the substrate which significantly improves coating uniformity.

28 Claims, 20 Drawing Sheets

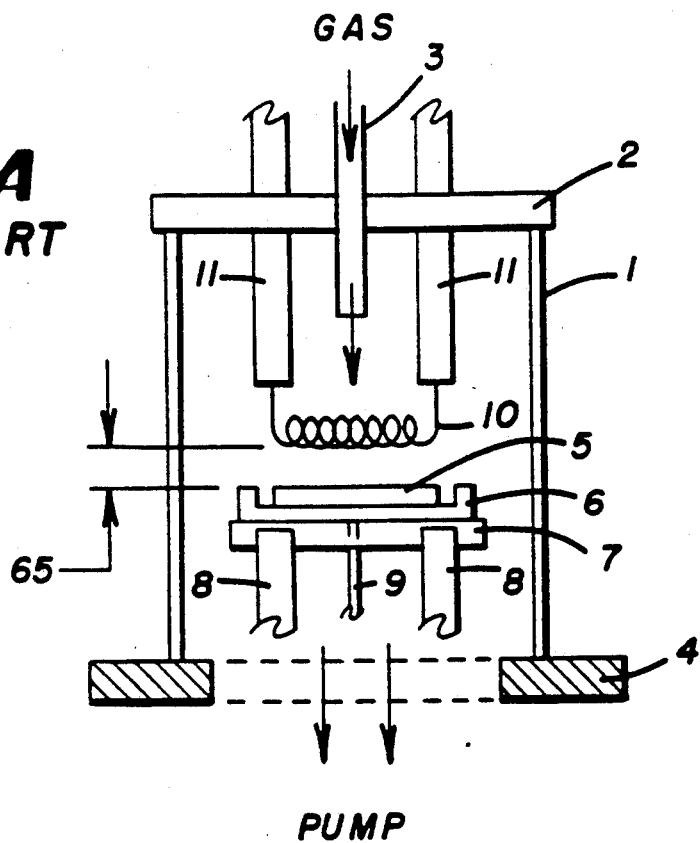
FIG. IA
PRIOR ART
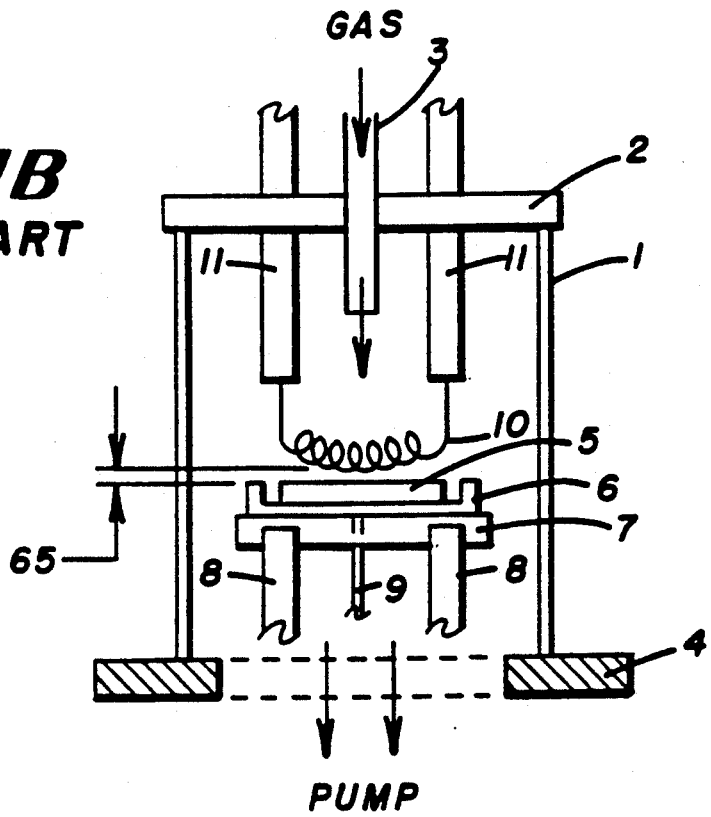
FIG. IB
PRIOR ART

HOT FILAMENT CHEMICAL VAPOR DEPOSITION REACTOR

FIELD OF THE INVENTION

This application is a continuation-in-part of U.S. application Ser. No. 497,159, filed Mar. 20, 1990 now abandoned. This invention relates to the art of chemical vapor deposition (CVD). More particularly, the invention relates to an improved hot filament chemical vapor deposition (HFCVD) reactor, and to a process for depositing a coating with uniform thickness and properties over the entire surface of a substrate.

BACKGROUND OF THE INVENTION

Chemical vapor deposition (CVD) is a well known coating process for producing semi-conducting electronic devices and modifying the surface properties, e.g. abrasive and erosive wear resistance, of a physical object (substrate). For many applications it is crucial that coatings, such as polycrystalline diamond films, be extremely uniform in terms of thickness, morphology, and properties. Inability to produce a sufficiently uniform coating in a practical reactor system can limit the usefulness of many otherwise promising CVD processes.

Hot filament chemical vapor deposition (HFCVD) has been extensively used by researchers to deposit polycrystalline diamond on a variety of substrates. The HFCVD techniques and/or reactor designs are, however, limited in their commercial usefulness due to the inability to produce a diamond coating on multiple pieces with sufficiently uniform thickness, morphology and properties.

The reactor designs typically used for HFCVD are described in detail by Singh, et al. of David Sarnoff Research Center, subsidiary of SRI International, in a research report entitled "Growth of Polycrystalline Diamond Particles and Films By Hot-Filament Chemical Vapor Deposition", and by S. Matsumoto, et al., in a research paper entitled, "Growth of Diamond Particles From Methane-Hydrogen Gas" published in *J. Material Science* 17, 3106 (1982). A schematic representation of a typical HFCVD reactor used in the above research report and paper is shown in FIG. 1A.

The noted reactor generally comprises a heat proof cylindrical wall tube 1, an end cap 2, a gas inlet tube 3, and a disk shaped base 4. A substrate 5 to be coated, is supported by a substrate holder 6 which rests on and is heated by a substrate heater 7. Substrate 5, substrate holder 6, and the substrate heater 7 are supported within the reactor by two rods 8 which are connected to base 4 by means not shown. Substrate heater 7 is provided with an electrical lead, not shown, which conducts an electrical heating current from a suitable source to the heater. Substrate heater 7 is also provided with a thermocouple 9, by which the temperature of substrate 5 may be measured and transmitted to an external indicating device by means of an electrical lead, not shown.

The reactant gas is introduced into the reactor chamber through gas inlet tube 3 and directed over a spiral filament 10. Filament 10 is supported within the reactor by two rods 11 which are removably secured to reactor cap 2. Filament 10 is also provided with an electrical lead, not shown, to which an electrical current is conducted from a suitable source.

Filament 10 is typically made of ~0.1 mm diameter wire. It is made from a high melting-point refractory metal, such as tungsten or tantalum. The filament 10 is generally heated to between 1800°–2300° C. by either an AC or DC power supply to dissociate the feed gas, containing a mixture of hydrogen and hydrocarbon, into precursors responsible for diamond formation. The precursors condense at the surface of substrate 5, placed on substrate holder 6 approximately ~2 to 20 mm from filament 10, to deposit polycrystalline diamond. The temperature of substrate 5 is generally maintained in the range of 700° to 1,000° C. by the radiation heat from filament 10, substrate heater 7, or by a combination thereof.

The typical HFCVD reactor design, as described above, is limited to research purposes where polycrystalline diamond is deposited on a small area (~1 cm$^2$) and on one piece at a time. It is not suitable for depositing a uniform polycrystalline diamond film on multiple small pieces simultaneously.

Numerous researchers have attempted to solve the coating uniformity problem by utilizing many different HFCVD reactor designs. Specific details vary, but most have common features. Illustrative is the improved version of an HFCVD reactor design disclosed by Carl E. Spear in a review paper entitled "Diamond-Ceramic Coating of the Future" published in *J. of Am. Ceram. Soc.* 72 (2), 171-91 (1989). A schematic representation of this improved reactor is shown in FIG. 2.

The noted reactor generally comprises a heat proof cylindrical wall tube 12, an end cap 13, a gas inlet tube 14, and a disk shaped base 15. A substrate 16 to be coated is supported by a substrate holder/heater 17. Substrate 16 and substrate holder/heater 17 are supported within the reactor by rods 19 which are connected to reactor base 15. Substrate holder/heater 17 is provided with an electrical lead, not shown, which conducts an electrical heating current from a suitable source to the heater. Substrate holder 17 is also provided with a thermocouple 18 by which the temperature of substrate 16 can be measured and transmitted to an external indicating device by means of an electrical lead, not shown.

With the noted reactor, reactant gas is introduced into the reaction chamber through a gas diffuser 20 which is connected to gas inlet tube 14. As the gas is introduced into the reaction chamber, it is directed over a spiral refractory metal filament 21. Spiral filament 21 is supported within the reaction chamber by rods 22 which are connected to reactor cap 13. Filament 21 is also provided with an electrical lead, not shown, to which an electrical current is conducted from a suitable source.

As the reactant gas is introduced into the reaction chamber through gas diffuser 20, it is directed over the heated filament 21. Base 15 is provided with a gas outlet tube 23 for extracting the gas, as well as a gas feed line 24 for monitoring gas pressure within the reactor chamber.

Generally, the axial velocity of reactant gas from a central gas inlet tube 3, as shown in FIG. 1A, will induce a sharp temperature gradient in filament 10 at or near the point where gas impinges on the filament, resulting in its deformation (see FIG. 1B). The filament deformation changes the gap 65 between filament 10 and substrate 5, resulting in non-uniform deposition of polycrystalline diamond film. Gas diffuser 20 used in the noted design (see FIG. 2) helps alleviate to some extent the problems associated with filament deformation. The reactor design is not, however, suitable for depositing a uniform polycrystalline diamond film on multiple small pieces simultaneously.

Further examples of prior art techniques for depositing diamond by HFCVD are as follows: Japanese Patent Application No. 61-302,131, filed Dec. 17, 1986, describes a pre-treatment technique (carburization) for stabilizing the filament surface and prolonging its life against hydrogen embrittlement and water etching. The method, however, suffers from the same drawbacks as described above. It, too, is not suitable for depositing a uniform diamond film on multiple small pieces simultaneously.

U.S. Pat. Nos. 4,707,384 and 4,734,339 describe methods for producing a composite body with one or more polycrystalline diamond layers by HFCVD. However, the methods are directed to using a conventional HFCVD reactor as described above and suffer from similar drawbacks.

Japanese Kokai Patent No. 63-166,797, published Jul. 9, 1988, describes a method of synthesizing diamond using 0.1 mm dia. filament made of an alloy of Ta and Zr and/or Hf such that the proportion of Ta in the alloy is >60% and is <99%. This application does not address the deposition of polycrystalline diamond on multiple small pieces simultaneously.

Japanese Kokai Patent No. 63-159,292, published Jul. 2, 1988, describes a process for depositing diamond film on a substrate with a large surface area and on a curved surface. The process describes using a high-melting point filament in conjunction with a high-melting point metal mesh placed between the substrate and the filament, and applying a positive bias potential with respect to the filament through the metal mesh to deposit diamond on large surface areas. Both the filament and the wire mesh are heated electrically. This process is strictly an electron bias assisted HFCVD and is substantially different from a conventional HFCVD process and the present invention.

European Patent Application Nos. 254,312 and 254,560 disclose an apparatus and methods of depositing polycrystalline diamond using a DC-bias HFCVD method. The method has been claimed to be suitable for depositing diamond coating on large areas. The method, however, does not describe the use of conventional HFCVD to deposit a diamond coating uniformly on multiple small pieces simultaneously.

From the foregoing, it will be seen by those skilled in the art that prior art conventional HFCVD techniques (without the use of electrical bias techniques) are limited to depositing uniform polycrystalline diamond on small areas and on one piece at a time.

It is also recognized by those skilled in the art that a need exists for an improved HFCVD reactor which, in combination with appropriate processing conditions, effectively controls the gas pressure and temperature gradients, and gas flow within the reactor in such a way as to produce uniform polycrystalline diamond coatings on multiple small substrates simultaneously.

SUMMARY OF THE INVENTION

The disclosed CVD reactor substantially reduces or eliminates the disadvantages and shortcomings associated with the prior art techniques. The extent of radial gas flow from a stagnation point is controlled so that a uniform deposit of material can be achieved over the entire surface of multiple small pieces simultaneously.

Generally, reactant gas is introduced into the reactor chamber through a gas dispersion system. The gas dispersion system, mounted within the reactor chamber, has a configuration to introduce the gas into the reaction zone with a desired axial velocity profile.

As the gas is introduced into the reaction zone, the gas is directed through a novel filament network, also mounted within the reactor chamber. The filament network is positioned and configured to heat the gas to a desired temperature and to generate active species for the diamond deposition reaction.

A substrate support means, also mounted within the reactor chamber, is provided to support the substrate within the reaction zone. The support means is positioned and configured to reduce the extent of radial gas flow adjacent to the substrate outward from a single stagnation point, which significantly improves coating uniformity.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which:

FIGS. 1A, 1B and 2 are schematic diagrams of HFCVD reactors according to typical configurations of prior art;

DETAILED DESCRIPTION OF THE INVENTION

The HFCVD reactor of the present invention substantially reduces or eliminates the disadvantages and shortcomings associated with the prior art techniques. According to the invention, a gas dispersion system, a filament network and a support means are provided for counteracting the natural pressure and temperature gradients arising within the reactor so that a uniform deposit of material can be achieved over the entire surface of multiple small pieces simultaneously.

A key feature of the invention is the support means. The support means comprises a support plate containing a plurality of apertures, a wire mesh support or a series of cross bars. The support means is designed to have a surface area to support multiple substrates while substantially reducing the extent of radial (stagnation point) gas flow adjacent to the substrate which significantly improves coating uniformity. The surface area of the support means should be sufficiently large to hold a plurality of substrates. The optimum distribution of apertures or other openings in the support means depends on the reactor diameter or cross-sectional area, length of the reaction zone where uniform flow is required, gas pressure and temperature, and volumetric flow rate of the reactive gas.

In a preferred embodiment of the present invention, the filament network is interposed between the gas dispersion system and the support means to heat the reactant gas to a desired temperature and generate active species for the diamond deposition reaction. The distance between the filament and the substrate supported on the support means is in the range of about 3 mm to 20 mm, preferably about 8 mm to 15 mm. The filament network is made of 0.2 to 1.5 mm diameter refractory metal wire bent in one of a variety of shapes. The filament network may also consist of a series of parallel wires, twisted wires, and the like, to cover a large coating area. The use of a thicker wire helps in providing structural integrity to the filament network as well as prolonging filament life.

The gas dispersion system consists of a thin housing, with the top and bottom surfaces forming a chamber within. The bottom surface of the housing is apertured to admit the reactant gas to the reaction zone of the reactor. The apertures are arranged and configured to introduce the reactant gas to the reaction zone and through the filament network with a desired axial velocity profile. The dispersion plate functions in conjunction with the support plate to control gas flow adjacent to the surfaces of multiple small substrates. The technical advantage of this arrangement is that polycrystalline diamond film exhibiting uniform thickness, morphology, and properties, may be deposited on multiple small pieces simultaneously.

Figure 2:
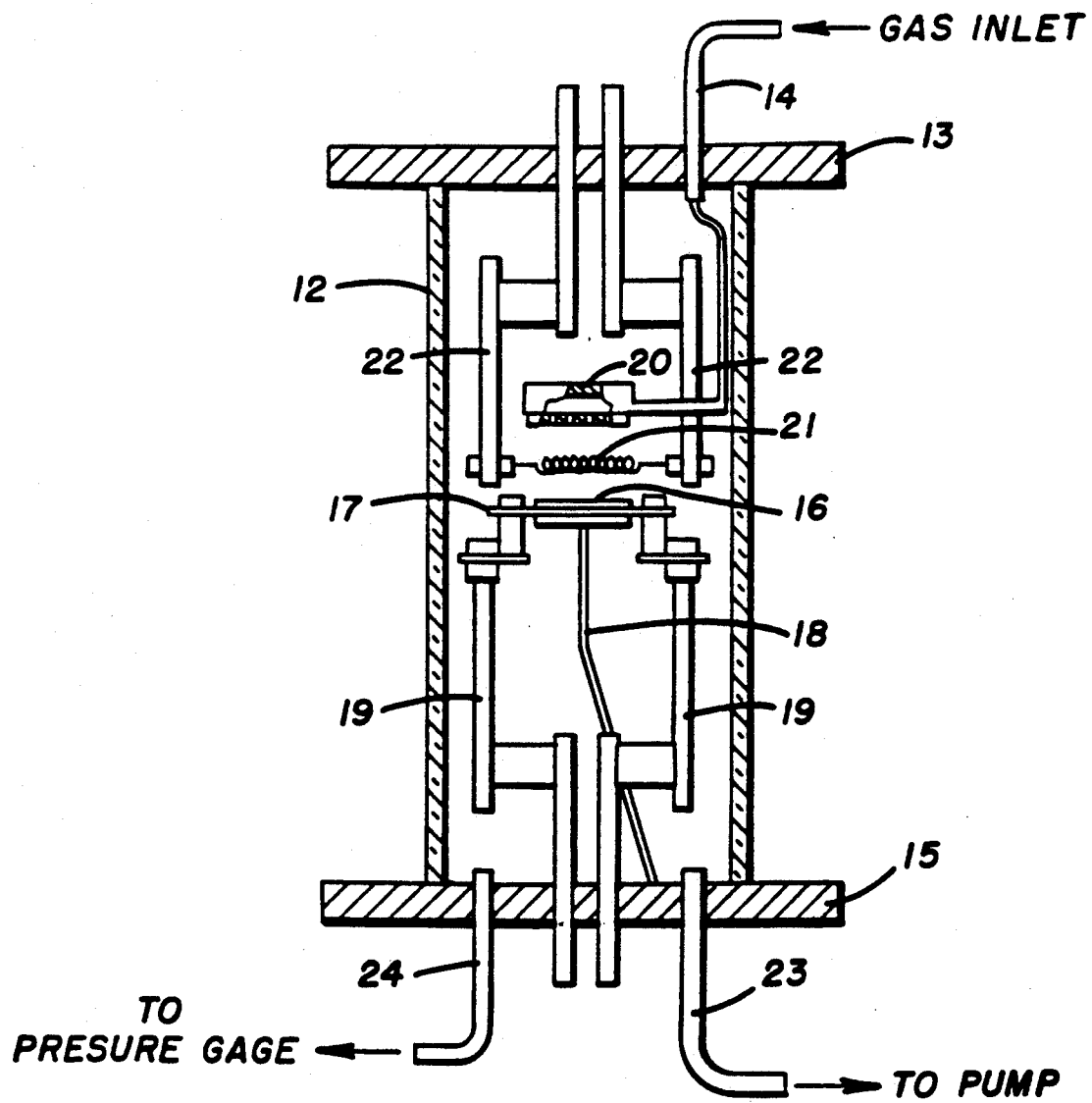
Figure 3:
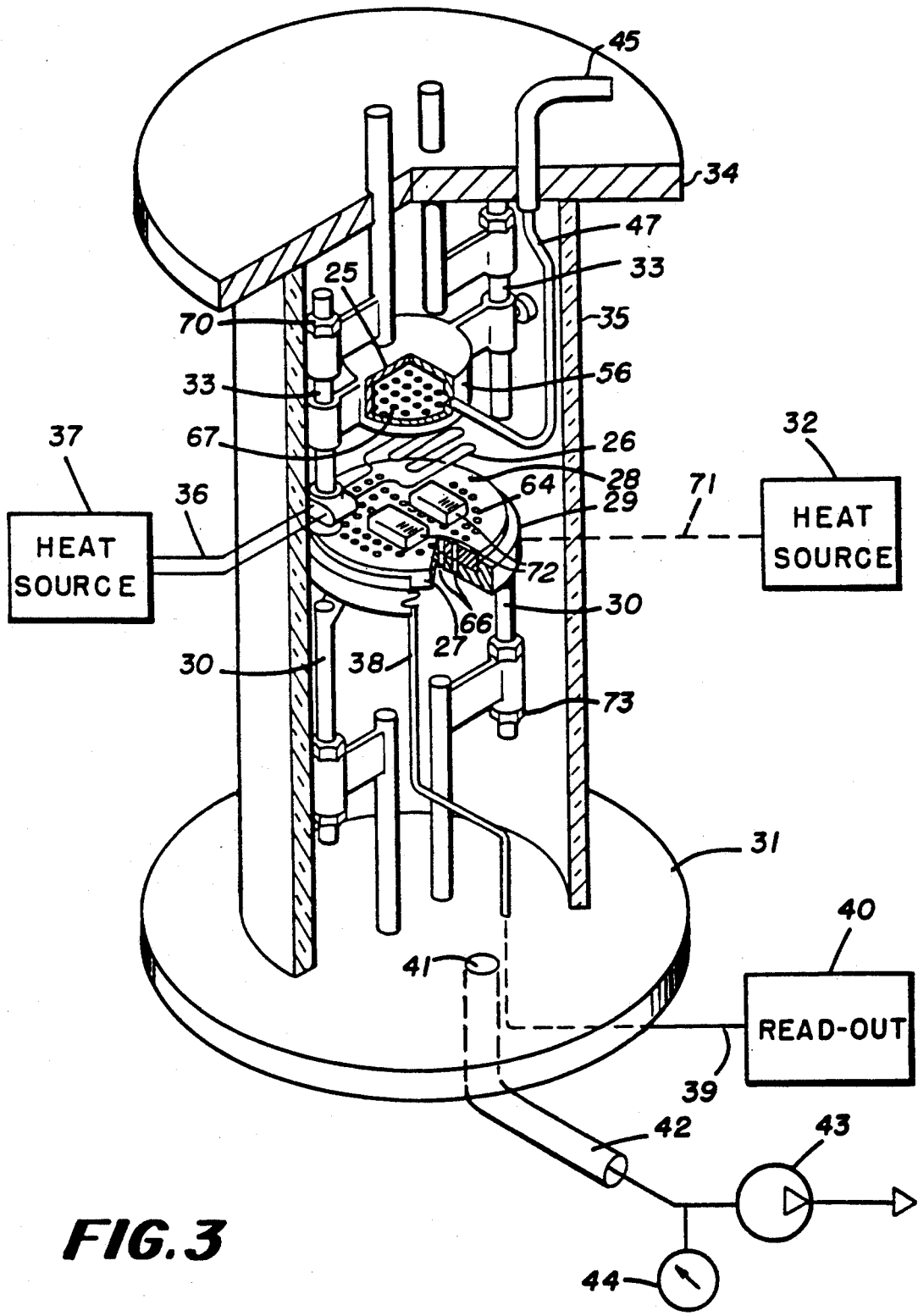
FIG. 3 is a simplified sectional view of the improved HFCVD reactor according to the present invention.

FIG. 3 is a simplified sectional view of the HFCVD reactor according to the present invention. In the following description of the invention, the reactor is oriented vertically and gas flow is downward. However, this does not imply that the invention is limited to this arrangement of flow. Vertical upward flow, and in some cases horizontal flow, are included as embodiments of the present invention.

The key elements of the improved HFCVD reactor comprise a gas dispersion system 25, a filament network 26 and an apertured support plate 27. Gas dispersion system 25 and apertured support plate 27 are oriented within the reactor so that their surfaces are perpendicular to the axis of the gas flow through the reaction zone 28. The substrates 72 to be coated are supported by apertured support plate 27 which rests on an apertured substrate heater 29. Substrate heater 29 is attached to adjustable rods 30, which are mounted to the reactor base 31. Substrate heater 29 is provided with lead 71 to which an electrical heating current is conducted from a suitable heat source 32. Substrate holder 27 is also provided with a thermocouple 38 to measure substrate temperature and a connecting electrical lead 39 through which the thermocouple output may be transmitted to an external indicator or read-out 40.

Figure 4A:
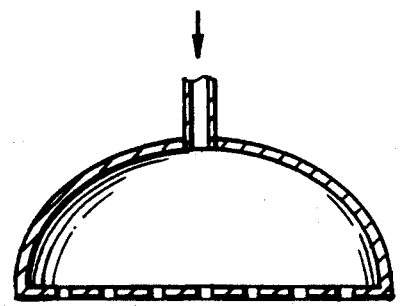
FIGS. 4A, 4B, 4C and 4D are sectional views of various embodiments of gas dispersion systems that can be used in place of gas dispersion system 25 shown in FIG. 3.
Figure 4B:
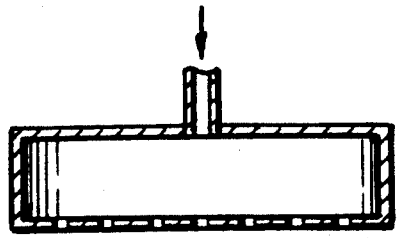
Figure 4C:
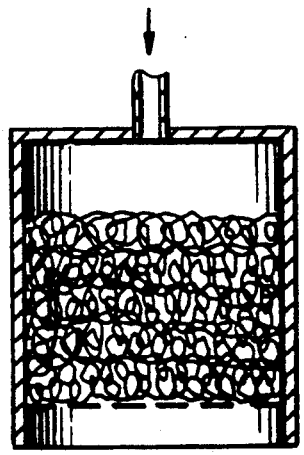
Figure 4D:
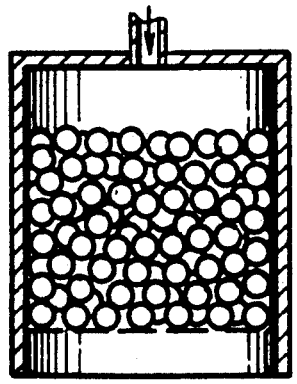
Figure 5A:
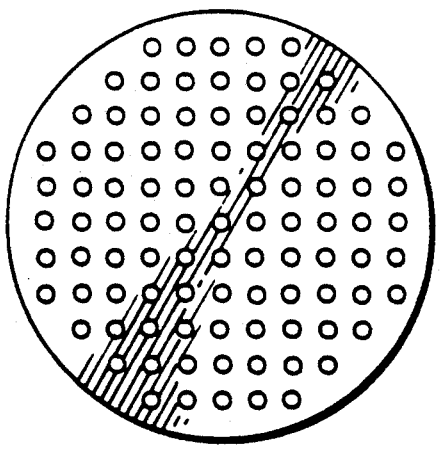
FIGS. 5A, 5B, 5C, 5D and 5E are plan views of various support plates according to the invention.
Figure 5B:
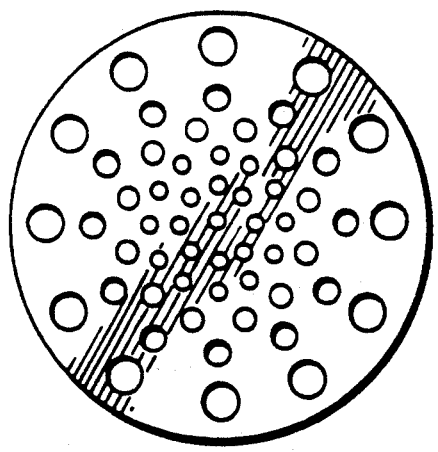
Figure 5C:
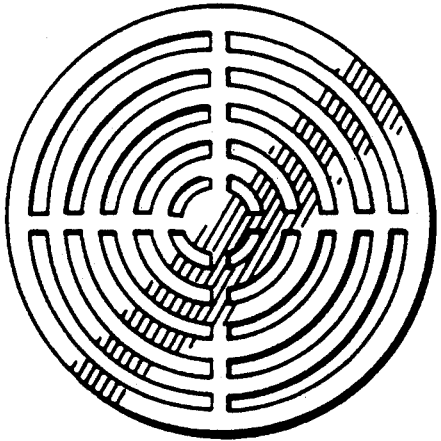
Figure 5D:
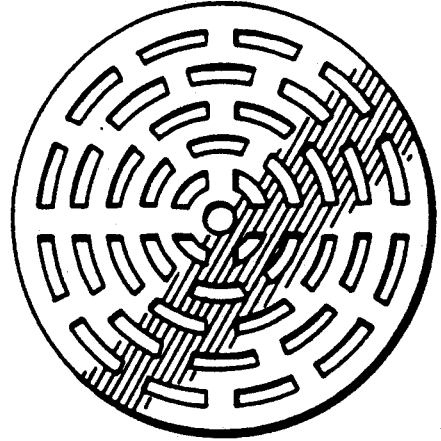
Figure 5E:
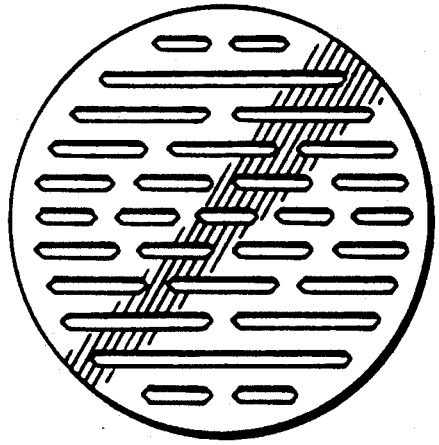

In place of gas dispersion system 25, a pipe or other suitable housing containing a finely dispersed, inert solid packing material, such as glass wool or stainless steel wool supported on a stainless steel or ceramic wire mesh may be used as shown in FIG. 4C or glass or ceramic beads on the same type of support as shown in FIG. 4D. In such an embodiment, the gas dispersion system resembles a packed bed distributing effectively the feed gas across the entire cross-section of the pipe. Other designs of the gas dispersion system are shown in FIGS. 4A and 4B.

The reactor shown in FIG. 3 is enclosed by a heat proof external wall 35 of quartz, stainless steel or other suitable material. The ends of the reactor are enclosed by removable bottom plate 31 and top plate 34 which isolate the reactor such that the interior can be evacuated without significant inward leakage from the surrounding ambient atmosphere.

In order to regulate the gas pressure within the reactor chamber and remove reaction product gases, bottom plate 31 of the reactor is provided with an opening 41 therein through which an exhaust port tube 42 is suitably connected to a vacuum pump 43. A vacuum gauge 44 is connected in the line thereto for indicating the pressure within the reactor chamber. By properly operating vacuum pump 43, the gas pressure within the reactor chamber may be regulated as desired.

A gas inlet tube 45 is provided which extends through the top plate 34. Gas inlet tube 45 is suitably connected to gas dispersion system 25 by means of a gas feed line 47. Gas inlet tube 45 is connected to a gas feed system (not shown) to introduce reactant gases into the reactor at desired flow rates.

Apertured support plate 27 of the invention is interposed between gas dispersion system 25 and substrate heater 29. The support plate is removably secured to substrate heater 29 and can be constructed of a rigid graphite, ceramic or metallic material.

A conventional HFCVD reactor design utilizes a flat rectangular or circular substrate holder over which a small substrate is placed for CVD coating. The gas flow adjacent to the substrate surface is therefore generally radial outward from a stagnation point, resulting in non-uniform deposition of polycrystalline diamond.

In the present invention, apertures 64 (FIG. 3) in support plate 27 and apertures 66 in heater 29 provide a means of flowing the reactant gas through support plate 27, thereby reducing the extent of radial (stagnation point) flow adjacent to substrates 72 and improving coating uniformity thereon. The optimum configuration and distribution of apertures 64 and 66 depends on the reactor diameter or cross-sectional area, length of reaction zone 28, gas pressure and temperature, and volumetric flow rate of the reactant gas.

FIGS. 5A–E are plan views of various embodiments of substrate support plate 27 according to the invention. Many different designs are acceptable for the individual openings in plate 27; circular, triangular, rectangular or square holes, rectangular slots, segmented annular rings and other types of apertures can be used. However, the best relative locations and sizes of the apertures depends on the specific case for which the plate is designed. The example support plates illustrated in FIGS. 5A–E are not comprehensive, and other plates may be designed within the scope of the invention.

The support plate 27 and substrate heater 29 assembly is also provided with adjustable support rods 30 for varying the distance between substrates 72 and filament network 26; support rods 30 consisting of threaded posts with lock nuts 73 removably secured thereon.

With the noted reactor apparatus, reactant gas is introduced into the reactor chamber through the gas inlet tube 45 and gas feed line 47. Gas feed line 47 is connected to gas dispersion system 25 which introduces the reactant gas into reaction zone 28 of the reactor with substantially uniform axial gas velocity and temperature. Gas dispersion system 25 is supported within the reactor by a pair of adjustable rods 33, suitably connected to reactor cap 34; rods 33 consisting of threaded post with suitable lock nuts 70 removably secured thereon.

A typical HFCVD reactor design utilizes a single gas feed line 3 (or nozzle) to direct the reactant gas over a spiral filament 10 (see FIG. 1A). The flow of reactant gas over heated filament 10 induces a sharp temperature gradient in filament 10, at or near the point of impingement of the gas, resulting in filament deformation (see FIG. 1B). The filament deformation changes gap 65 between filament 10 and substrate 5, resulting in non-uniform deposition of polycrystalline diamond films.

Gas dispersion system 25 of the present invention controls filament deformation and enhances the life of the filament. The gas dispersion shown in FIG. 3 system consists of a thin housing 56 with an apertured bottom surface 67 to introduce and uniformly distribute the reactant gas over a novel filament network 26. Other configurations, as previously described, are also suitable.

Filament network 26 of the present invention is made of a high-melting point refractory metal wire such as tantalum, tungsten, molybdenum, rhenium or mixtures thereof, with a diameter of about 0.2 to 1.5 mm. The use of a wire whose diameter is at the higher end of this range helps in providing structural integrity to filament network 26 as well as prolonging filament life.

The filament network can also be a composite material comprising a core of a ceramic, graphite, carbon fiber, or carbon-carbon composite coated with a high-melting point refractory metal such as tantalum, tungsten, molybdenum, rhenium or mixtures thereof. The refractory metals can be deposited on the core to a thickness in the range of about 10 micron to 2000 microns by chemical vapor deposition, physical vapor deposition, thermal spray, plasma spray, electroplating or electroless plating technique. The diameter of the resulting composite filament can vary from about 1 mm to 3 mm.

Filament network 26 is supported in reaction zone by one of the adjustable rods 33. The filament network 26 is provided with lead 36 to which the heating current is conducted from a suitable electric source 37. Filament network 26 extends transversely in the reaction zone 28 of the reactor and is oriented such that the maximum cross-sectional area of filament network 26 is perpendicular to the axis of the gas flow in reaction zone 28. In the preferred embodiment of the invention, the cross-sectional area of filament network 26 is greater than the cross-sectional area of bottom apertured surface 67 of gas dispersion system 25.

Figure 6A:
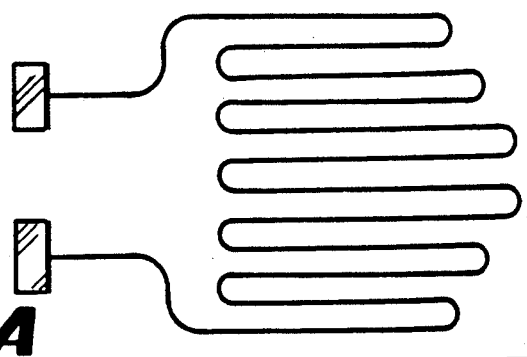
FIGS. 6A, 6B, 6C, 6D and 6E are plan views of various filament networks according to the invention.
Figure 6D:
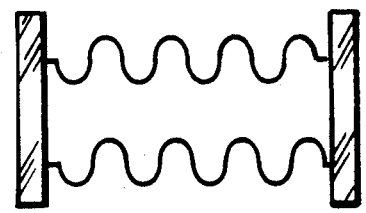
Figure 6B:
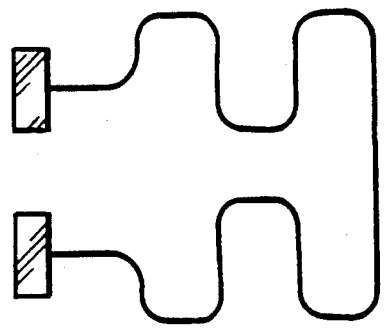
Figure 6E:
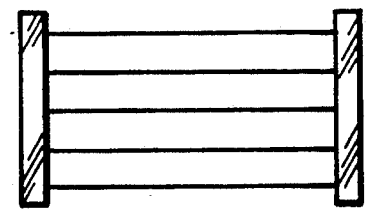
Figure 6C:
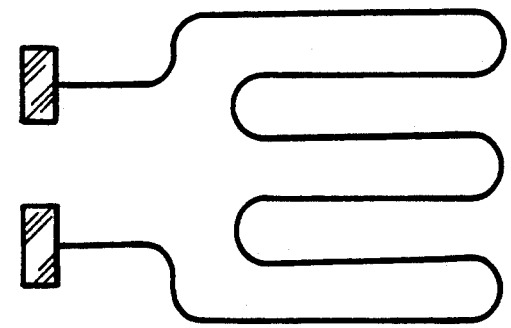

Filament network 26 may consist of a metal wire bent into one of a variety of shapes, as shown in FIGS. 6A–C. Network 26 may also consist of a series of parallel wires, twisted wires, and the like, to cover a large coating area. The continuous series of wires are bent and interconnected on each end thereof and the ends of the wires are configured and positioned in parallel and extend outside of network 26, as shown in FIGS. 6D and 6E. However, the best relative configuration of filament network 26 depends on the specific case for which network 26 is designed. The example filament networks illustrated in FIGS. 6A–E are not comprehensive, and other filament networks 26 may be designed within the scope of this invention to achieve the objectives of uniform deposition of polycrystalline diamond film on the surfaces of multiple pieces.

The controls and examples which follow illustrate the superior performance of the invention. The controls and examples are for illustrative purposes only and are not meant to limit the scope of the claims in any way.

PRE-CONDITIONING OF A NEW FILAMENT

A new tantalum filament made of 1 mm diameter and 21.6 cm long wire was fabricated and placed in the small scale HFCVD reactor described above. The total surface area of the filament was ~8.5 cm$^2$. It was carburized in the reactor using a preferred procedure. The procedure involved heating the filament to ~1800° C. in the presence of 100 sccm flow of 1% $CH_4$ in $H_2$ at 30 torr. The filament temperature was increased in steps of 50° C. every 30 minutes until a temperature of ~2200° C. was reached. This temperature was maintained for 30 minutes. The temperature and flow rate of 1% $CH_4$ in $H_2$ were then reduced to 2100° C. and 20 sccm, respectively, and maintained for another 12 hours. The filament power was then turned off and it was cooled in flowing helium gas. The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing PCD films on metallic and ceramic substrates in all the controls and examples described below. In some of those controls and examples a used tantalum filament (filament used previously in depositing PCD films in one or more experiments) was utilized for depositing PCD films. In no case was a virgin tantalum filament used for depositing PCD films.

CONTROLS AND EXAMPLES

A series of computer simulations and actual polycrystalline diamond (PCD) deposition experiments were carried out to determine the flow pattern of gases in a HFCVD reactor as well as the quality of PCD film coatings. The computer simulations were done under typical processing conditions using a range of gas flow rates. The scale of the reactor simulated was in the same size range as the actual laboratory reactor used to deposit coatings, with a similar configuration. The computer simulations required the simplifying assumption of axial symmetry in order to make the problem tractable. However, the following important parameters were essentially identical for the simulations to those in the actual reactor:

Filament, substrate and reactor wall temperatures
Filament diameter, length and total surface area
Total substrate surface area
Total aperture cross-sectional and vertical wall area
Gas pressure, inlet temperature, composition and flow rate By maintaining these parameters for the simulations, the relationship of buoyant forces to inertial forces (which determines whether natural convection cells can develop within the reactor) will be the same for the simulations as in the actual reactor. The computer modeling will therefore properly predict the qualitative nature of the gas flow pattern within the reactor and over the substrate surface. Simulations were done at both high and low flow rates, essentially covering the range used in this particular experimental apparatus.

Control 1a

Computer Simulation of a Typical HFCVD Reactor—Low Flow Rate

Figure 7:
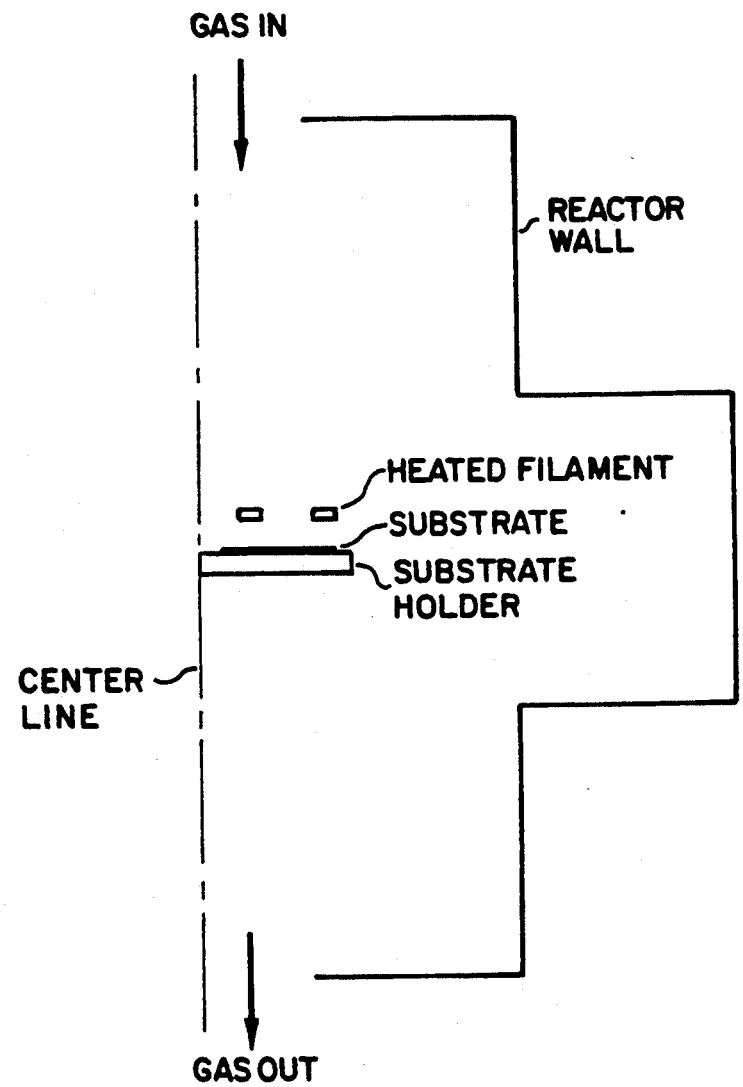
FIG. 7 is a schematic diagram illustrating the typical HFCVD reactor configuration employed in various computer simulations.

A 1.0 inch diameter substrate holder was positioned in the center of a cylindrical ~3" diameter six-way cross, with its flat surface perpendicular to the axis of the reactor, as shown in FIG. 7. The gas flow was vertically downward. The feed gas was 99% hydrogen with 1% methane, at a feed temperature of 20° C. (67° F.) and a pressure of 30 torr. The total gas flow rate was 10 std cm$^3$/min.(SCCM) The reactor wall temperature was 80° C. (175° F.), the substrate temperature was 800° C. (1470° F.), and the filament temperature was 2200° C. (3990° F.), all of which are typical processing conditions.

Figure 8:
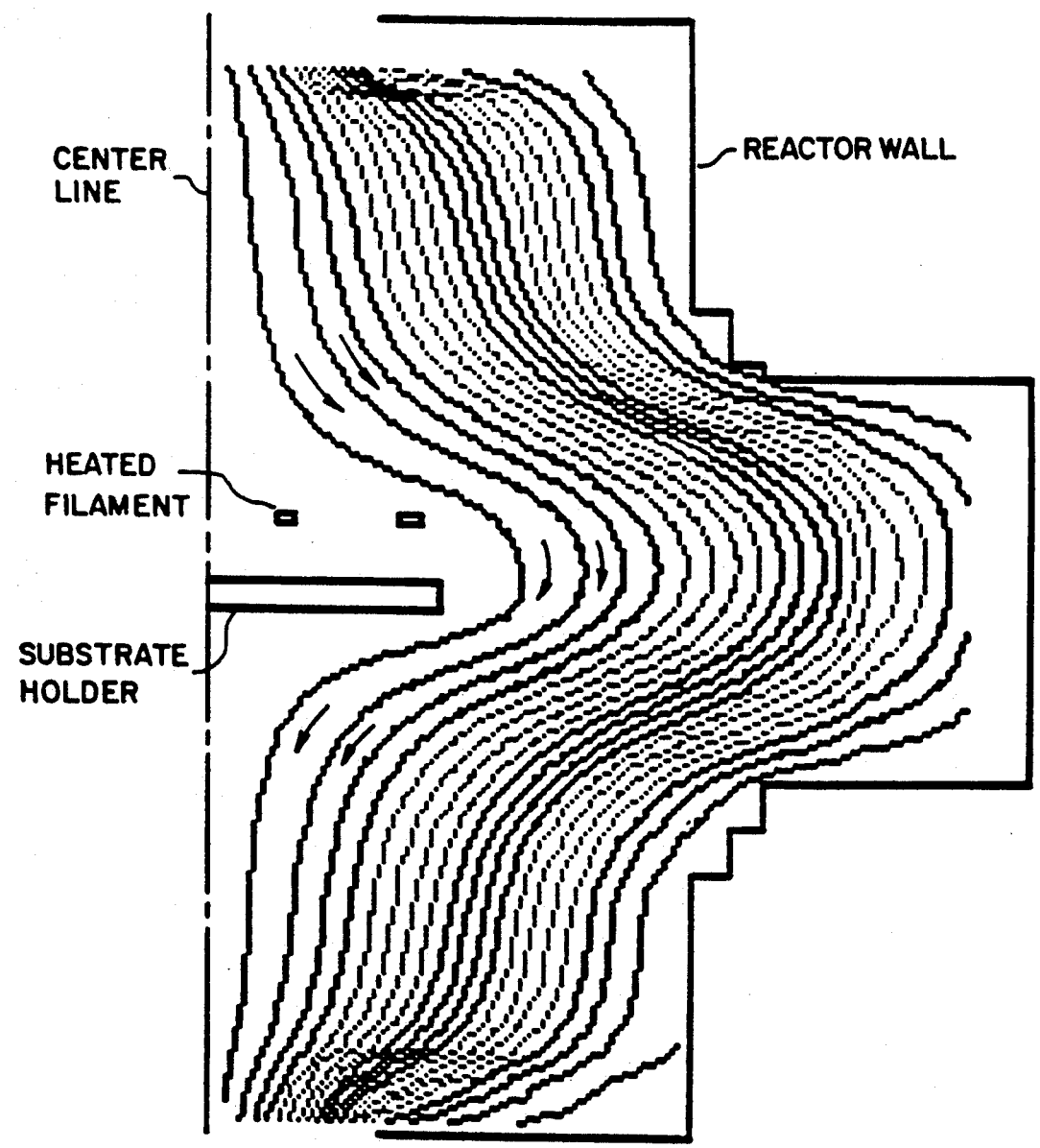
FIGS. 8 through 13 are graphs illustrating computer simulations of gas flow through a typical HFCVD reactor, whose design does not employ the principles of the present invention.
Figure 9:
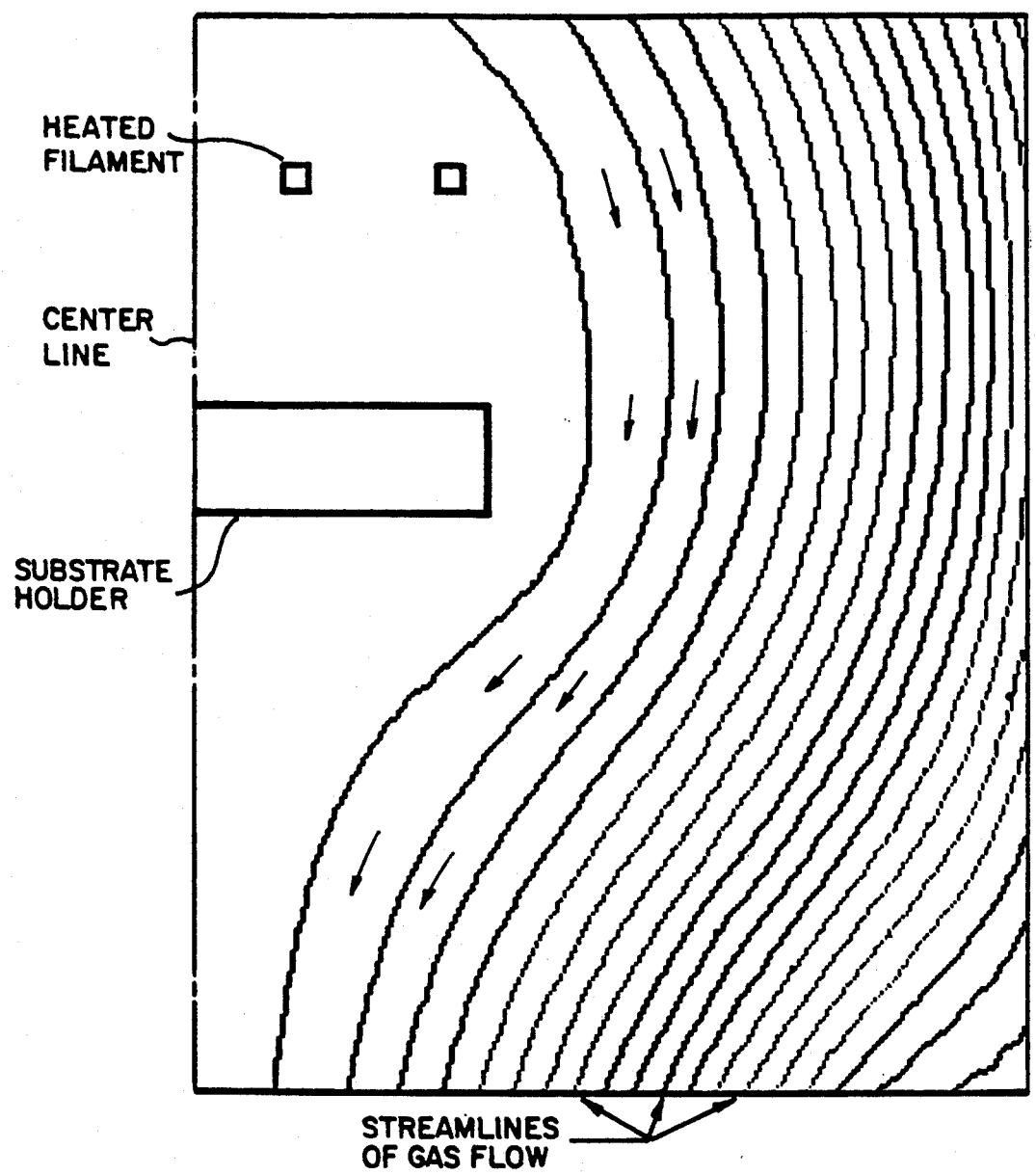

Gas flow under these conditions was laminar flow around the stationary substrate holder. FIGS. 8 and 9 present the streamlines of gas flow predicted by the computer simulation. (Note that the radial dimension of the objects in FIGS. 7, 8, 11, 14, 15 and 18 are magnified by a factor of 3 compared to the axial direction, to enhance clarity). As shown in FIGS. 8 and 9, under these conditions buoyant forces are insufficient to cause a natural convection recirculation to develop in the gas as it flows through the reactor. The bulk of the gas flow is diverted far upstream of the substrate, and does not reach the near vicinity of its surface.

Figure 10:
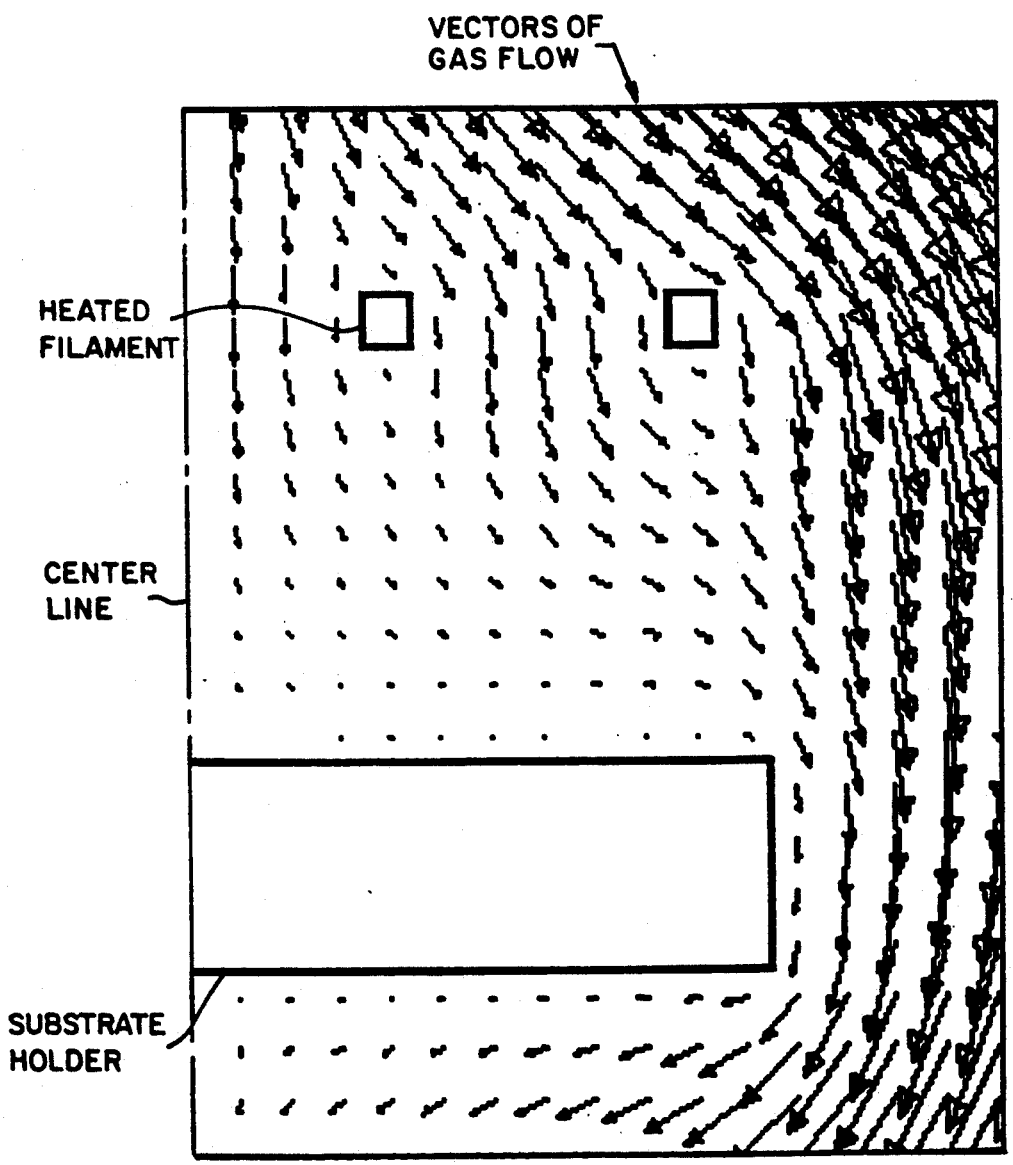
Figure 11:
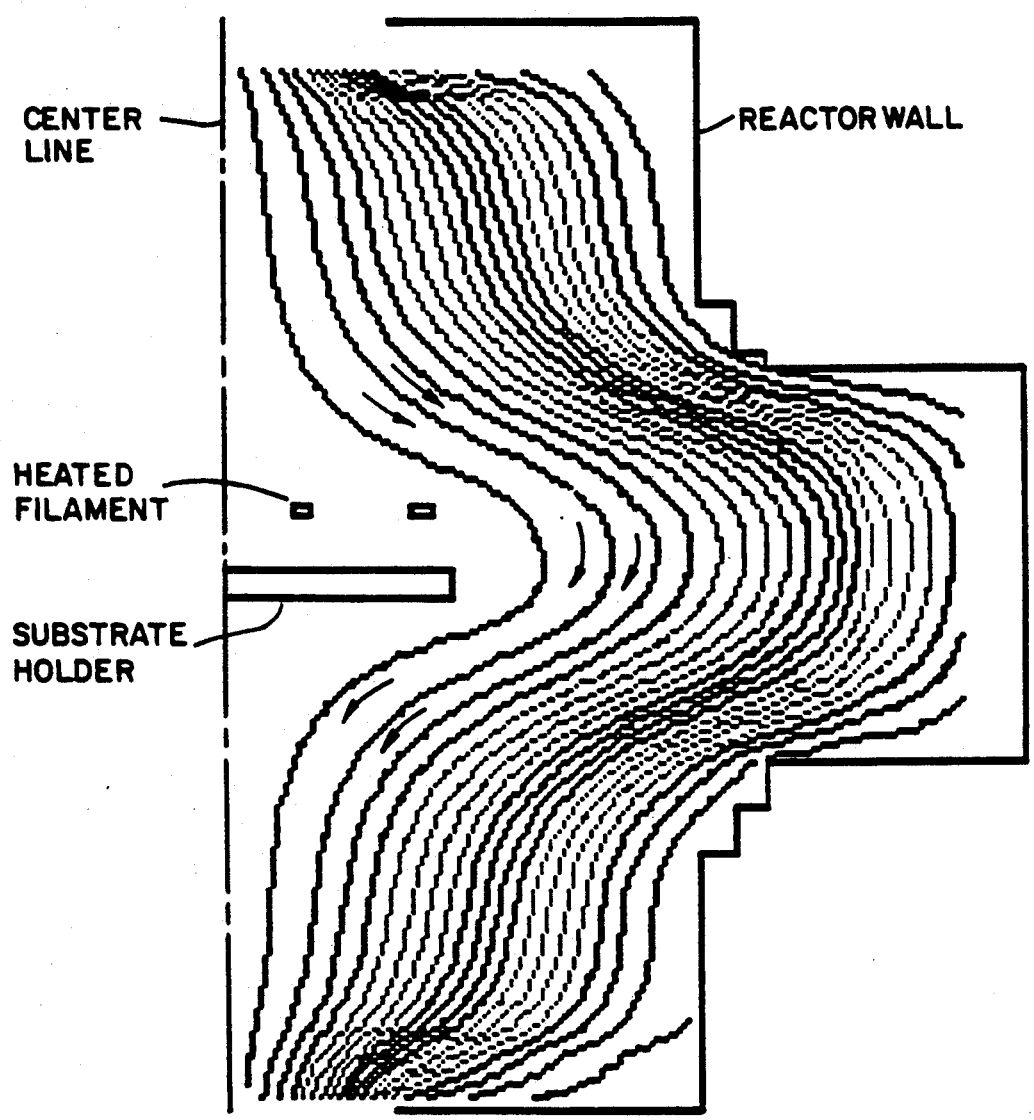

FIG. 10 is a highly magnified representation of the gas flow field for that small portion of the gas that reaches the vicinity of the substrate, as indicated by vectors of the gas velocity at various locations. Note that a stagnation point of the gas flow develops at the substrate's axis of symmetry, and that the flow just above its surface is radially outward. The radial component of the velocity at the first numerical grid location in the computer model just above the surface ranges between $2.0 \times 10^{-5}$ and $4.0 \times 10^{-5}$ ft/sec. over most of the surface.

The total distance traveled by the gas adjacent to the surface (from the point of stagnation to the outer edge, where it rejoins the bulk flow) is the complete radius of the substrate. This long flow path represents a long contact time, during which the concentration of reactive species can become depleted by deposition of the diamond film. This depletion can cause a change in deposition rate, thus producing a non-uniform (radial) coating.

Control 1b

Computer Simulation of a Typical HFCVD Reactor—High Flow Rate

Substrate, reactor geometry and processing conditions for this simulation were identical to Control 1a, except that the flow rate was raised to 100 SCCM. This higher flow rate was simulated to determine whether the gas flow pattern was qualitatively the same as at low flows, or whether some unusual feature would develop at the higher rate (such as a flow-driven recirculation cell).

Figure 12:
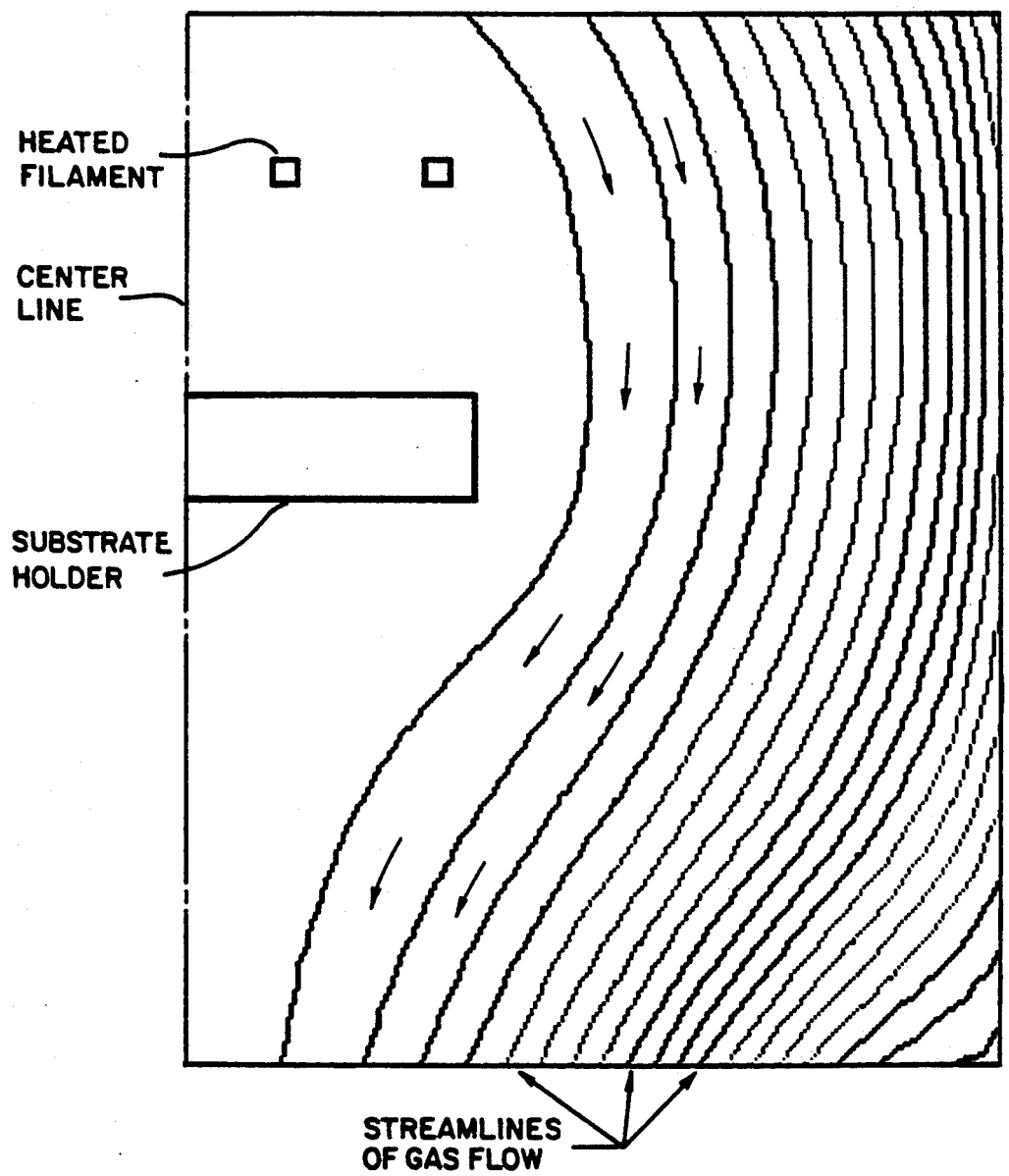

FIGS. 11 and 12 again indicate that the gas flow pattern is essentially laminar flow around a stationary object. Gas flow streamlines are diverted far upstream of the substrate, and the bulk of the gas does not reach the near vicinity of either the filament or the substrate surface.

Figure 13:
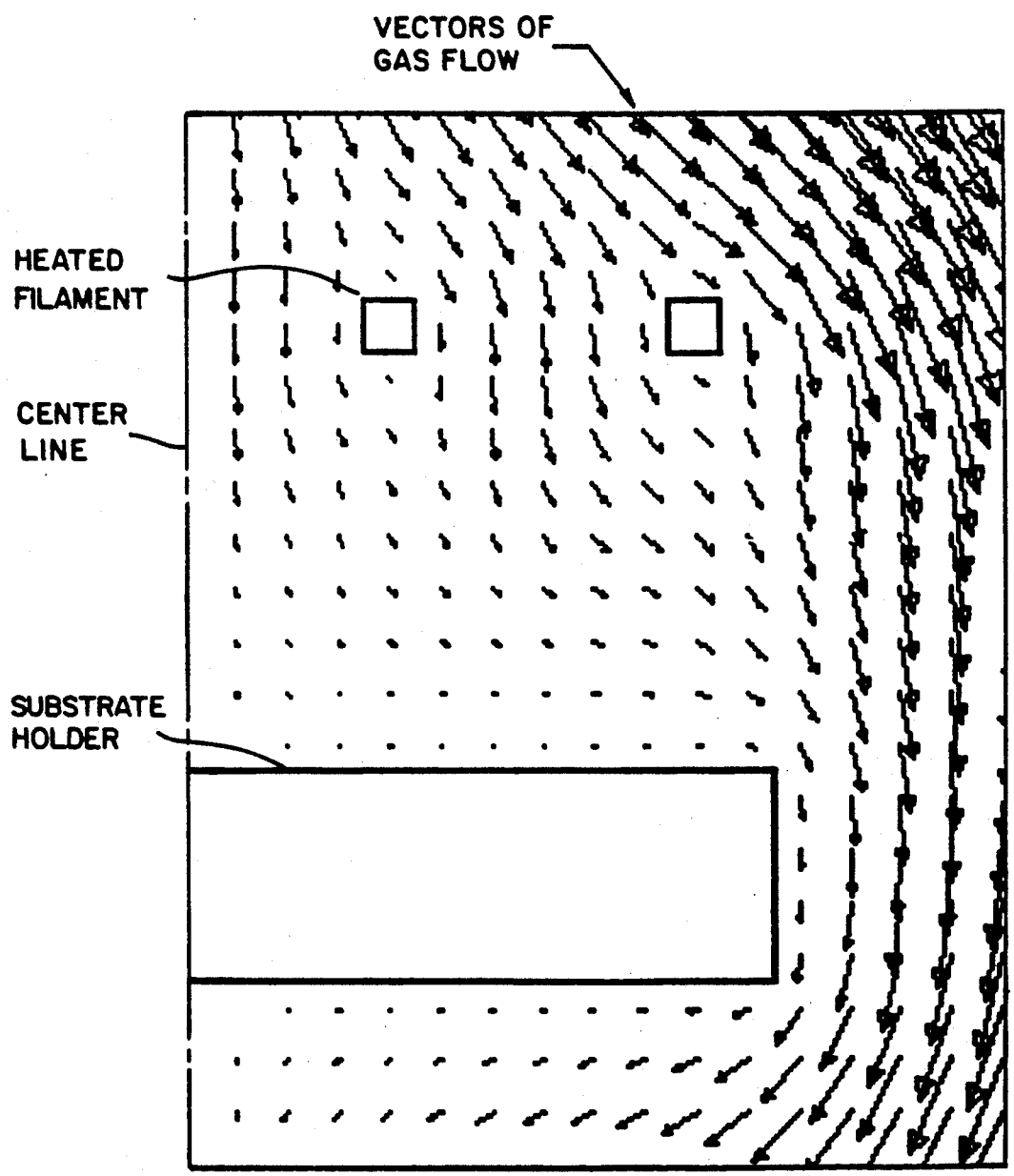

FIG. 13 represents the flow field adjacent to the substrate surface. As was the case for Control 1a at low flow rate, a stagnation point of the gas flow develops at the substrate's axis of symmetry, and the gas flow just above its surface is radially outward. The radial velocity varies from $2.5 \times 10^{-4}$ to $6 \times 10^{-4}$ ft/sec. over much of the substrate surface. The gas flow pattern is the same as in Control 1a, and the higher velocities are consistent with the higher gas flow through the reactor.

The total distance traveled by the gas adjacent to the substrate surface (from the point of stagnation to the outer edge, where it rejoins the bulk flow) is the complete radius of the substrate. Once again, this flow path represents a long contact time, during which the concentration of reactive species can become depleted by deposition of the diamond film. This depletion can cause a change in deposition rate, thus producing a radially non-uniform coating.

Control 1c

PCD Coating in a Typical HFCVD Reactor—10 SCCM Flow rate

Two 1.35" long×0.387" wide×0.062" thick molybdenum heat sinks were placed side by side on the top of a 1.5"×1.5" square substrate holder positioned in the center of a cylindrical ~3" diameter six-way cross, with its flat surface perpendicular to the axis of the reactor. A filament made of 1 mm diameter tantalum wire was placed ~10 mm from the heat sinks. The heat sinks were pre-etched with 3 micron diamond paste and deposited with PCD film using 10 SCCM of 0.5% CH$_4$ in hydrogen, 30 torr total pressure, and ~2180° C. filament and ~850° C. substrate temperatures for 13 hours. The heat sinks were deposited with non-uniform PCD film. The PCD coating in the middle of the heat sinks, near the stagnation point of the gases, was very thin and patchy.

Control 1d

PCD Coating in a Typical HFCVD Reactor—30 SCCM Flow Rate

The PCD coating experiment described in Control 1c was repeated using an identical reactor design, heat sinks, and surface preparation technique. The heat sinks were deposited with PCD film using 30 SCCM of 0.5% CH$_4$ in H$_2$, 30 torr total pressure, and ~2200° C. filament and ~850° C. substrate temperatures for 15 hours. The heat sinks were deposited with non-uniform and patchy PCD film similar to the ones described in Control 1c.

Control 1e

PCD Coating in a Typical HFCVD Reactor—30 SCCM Flow Rate

The PCD experiment described in Control 1d was repeated using identical set-ups and processing conditions. The deposition was conducted for 14 hours. The film was once again very non-uniform and patchy, especially near the stagnation point of the gas flow.

Control 1f

PCD Coating in a Typical HFCVD Reactor—60 SCCM Flow Rate

The PCD coating experiment described in Control 1c was repeated using an identical reactor design, heat sinks, and surface preparation technique. The heat sinks were deposited with PCD film using 60 SCCM of 0.5% $CH_4$ in $H_2$, 30 torr total pressure, and ~2160° C. filament and ~850° C. substrate temperatures for 12 hours. The heat sinks were again deposited with non-uniform and patchy PCD film similar to the ones described in Control 1c.

The computer modeling and actual deposition experiments described in Controls 1a to 1f clearly indicated that the typical reactor design was not suitable for depositing diamond coating uniformly on substrates.

The following examples of the present invention demonstrate that the presence of an aperture in the substrate holder significantly modifies the flow pattern in the near vicinity of the substrate surface, when depositing diamond coatings by the hot filament CVD method.

EXAMPLE 1

Computer Simulation of Modified HFCVD Reactor—Low Flow Rate

Figure 14:
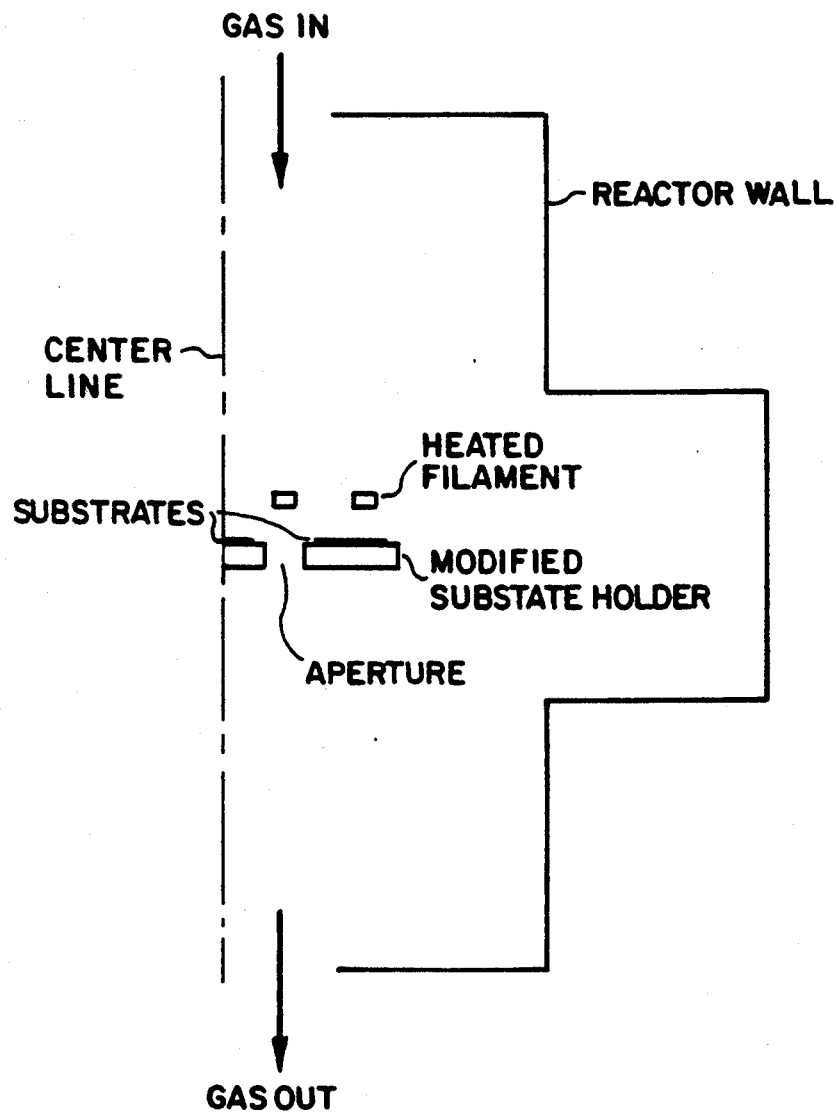
FIG. 14 is a schematic diagram illustrating the HFCVD reactor configuration, according to the present invention, employed in various computer simulations.

This example represents one embodiment of the present invention. The same 1.0 inch diameter substrate holder described in Control 1a, except for the presence of a circular aperture approximately halfway between the center and the outer edge, is positioned in the same reactor, as shown in FIG. 14. The computer simulation of Control 1a was repeated, while maintaining all input parameters (temperatures, pressure, gas composition and flow rate, reactor geometry) at the same values used previously.

Figure 15:
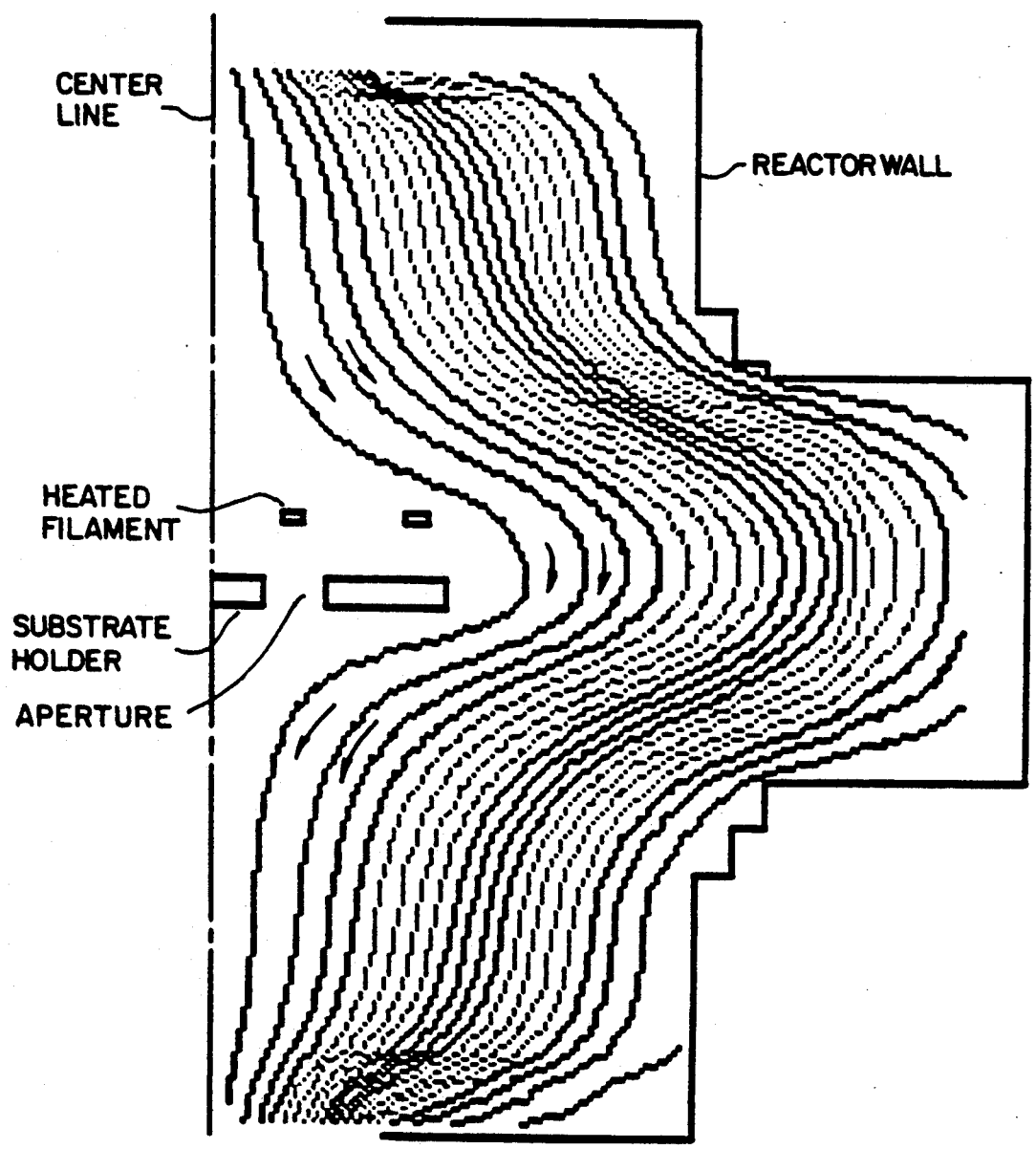
FIGS. 15 through 20 are graphs illustrating computer simulations of gas flow through a HFCVD reactor employing the principles of the present invention.
Figure 16:
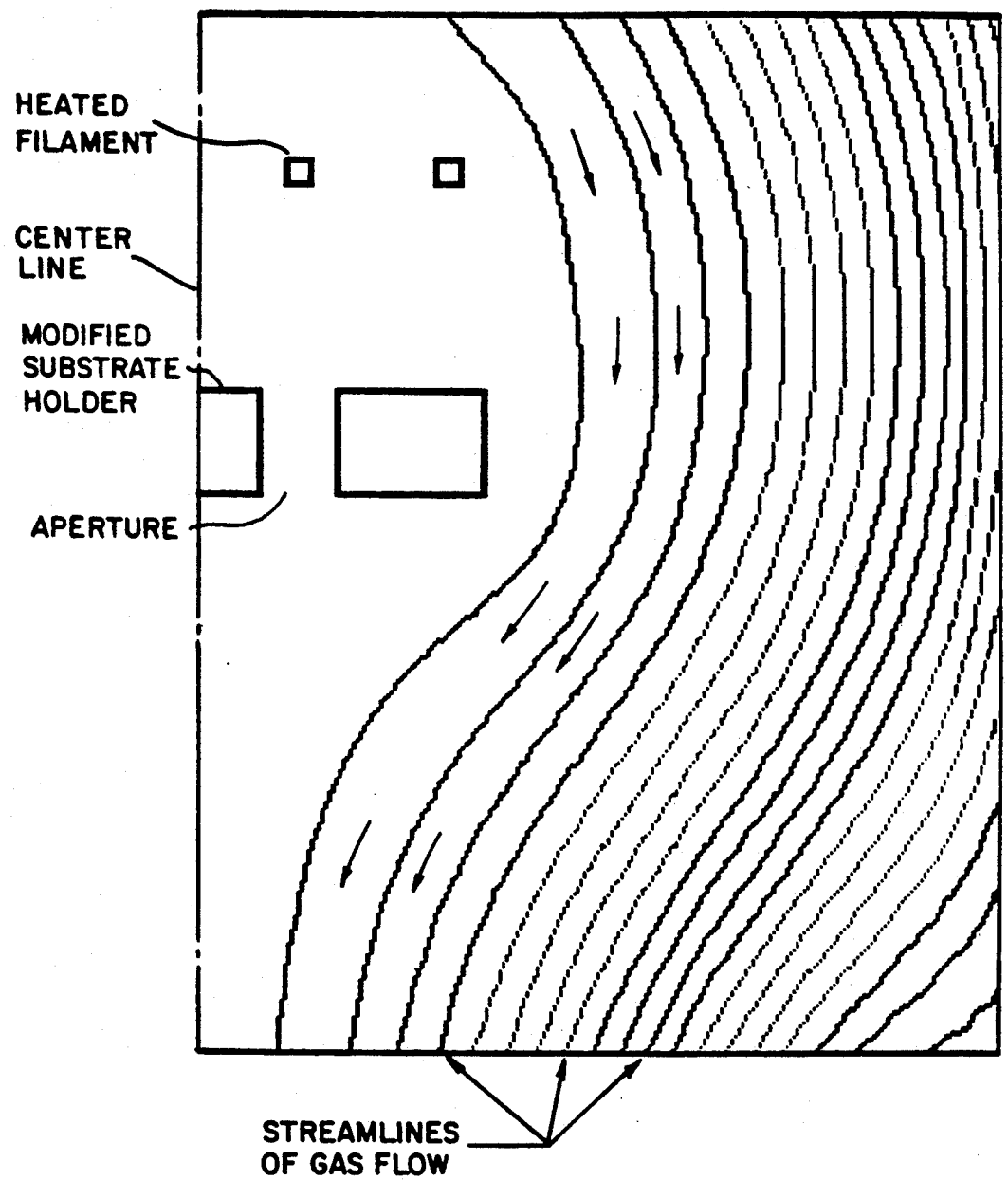

FIGS. 15 and 16 show the streamlines of gas flow predicted for the modified substrate holder. Once again the gas flow is laminar, with the bulk of the inlet gases diverted far upstream of the substrate. In fact, the location of the streamlines and the vectors of gas velocity at a large distance from the substrate (e.g. upstream of the filament) are essentially identical to those predicted in Control 1a. This indicates that the presence of the aperture has essentially no effect on the main gas flow through the reactor.

Figure 17:
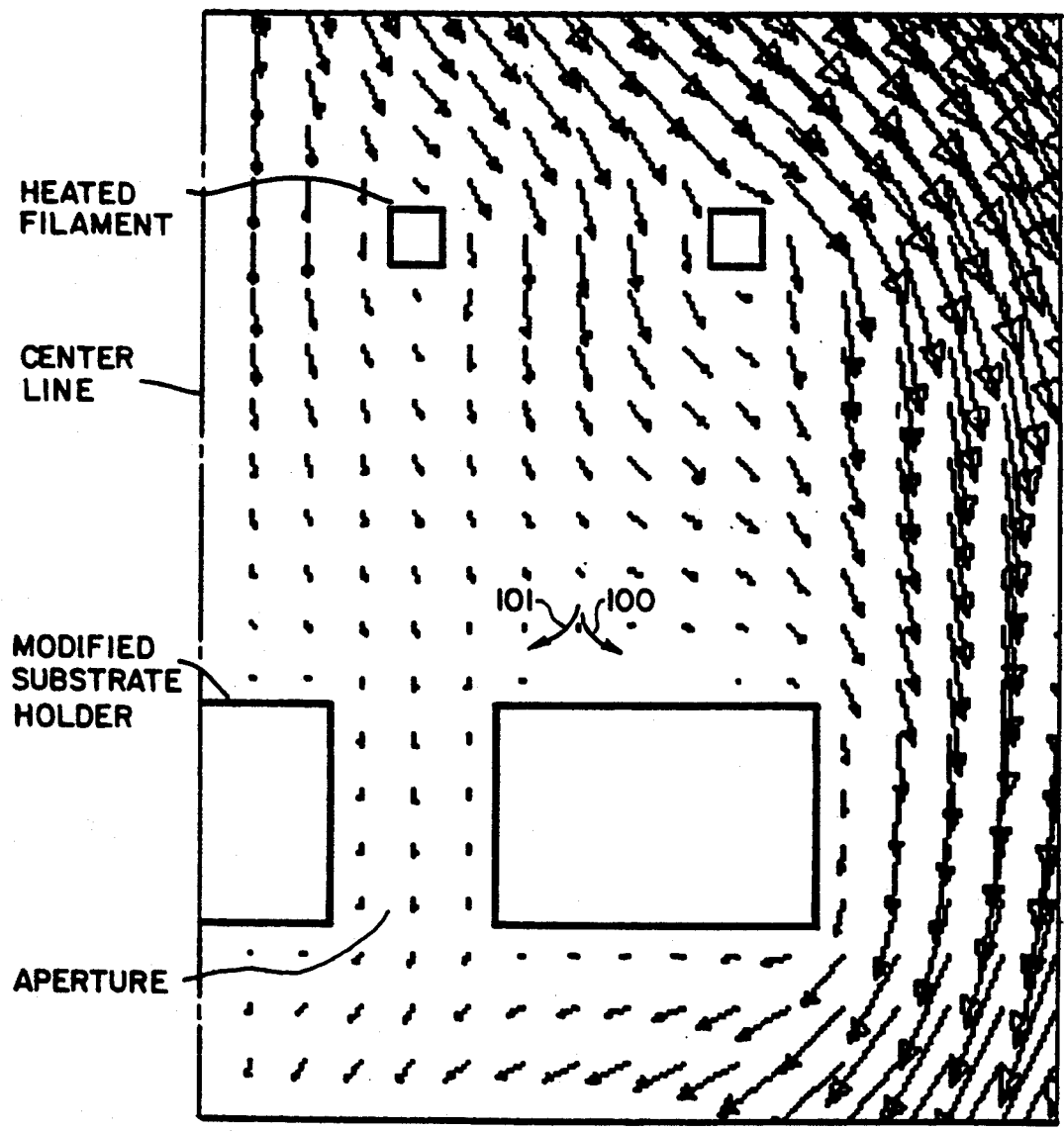

FIG. 17 is a highly magnified representation of the gas flow field adjacent to the substrate, as represented by vectors of the gas velocity at various locations. Note that there is a significant flow through the aperture, as shown by gas velocity vectors inside the aperture. Furthermore, there are two stagnation points of gas flow, one at the center of the substrate and one located between the aperture and the substrate's outer edge. Vectors 100 and 101 indicate the point of divergence of the vectors shown in FIG. 17. Vector 100 shows outward flow toward the edge of the substrate holder. Vector 101 shows inward flow toward the aperture.

Gas flow adjacent to the substrate surface is again radial, but no longer is the gas flow radially outward from the center of the substrate all the way to the outer edge. Instead, flow is radially inward over a portion of the surface between the outer stagnation point and the aperture. In addition to a different direction of flow, the magnitude of the velocity also differs from Control 1a. The radial component of the velocity at the first grid point above the surface varies over a much wider range than in the absence of the aperture, reaching a maximum velocity of $1.3 \times 10^{-4}$ ft/sec.

The average distance of the radial flow (before the gas rejoins a stream in axial flow) is much shorter than in Control 1a. Combined with the higher radial velocities, this produces a smaller contact time, with less opportunity for depletion of reactive species due to deposition of the diamond film. This implies that there will be less radial non-uniformity of coating than in Control 1a.

EXAMPLE 2

Computer Simulation of Modified HFCVD Reactor—High Flow Rate

This example represents a further embodiment of the present invention. The same 1.0 in. diameter substrate holder as in Example 1, including the circular aperture approximately halfway between the center and the outer edge, was positioned in the same reactor as for all previous controls and examples. The computer simulation of Control 1b was repeated, maintaining all input parameters (temperatures, pressure, gas composition and flow rate, reactor geometry) at the same values used in Control 1b.

Figure 18:
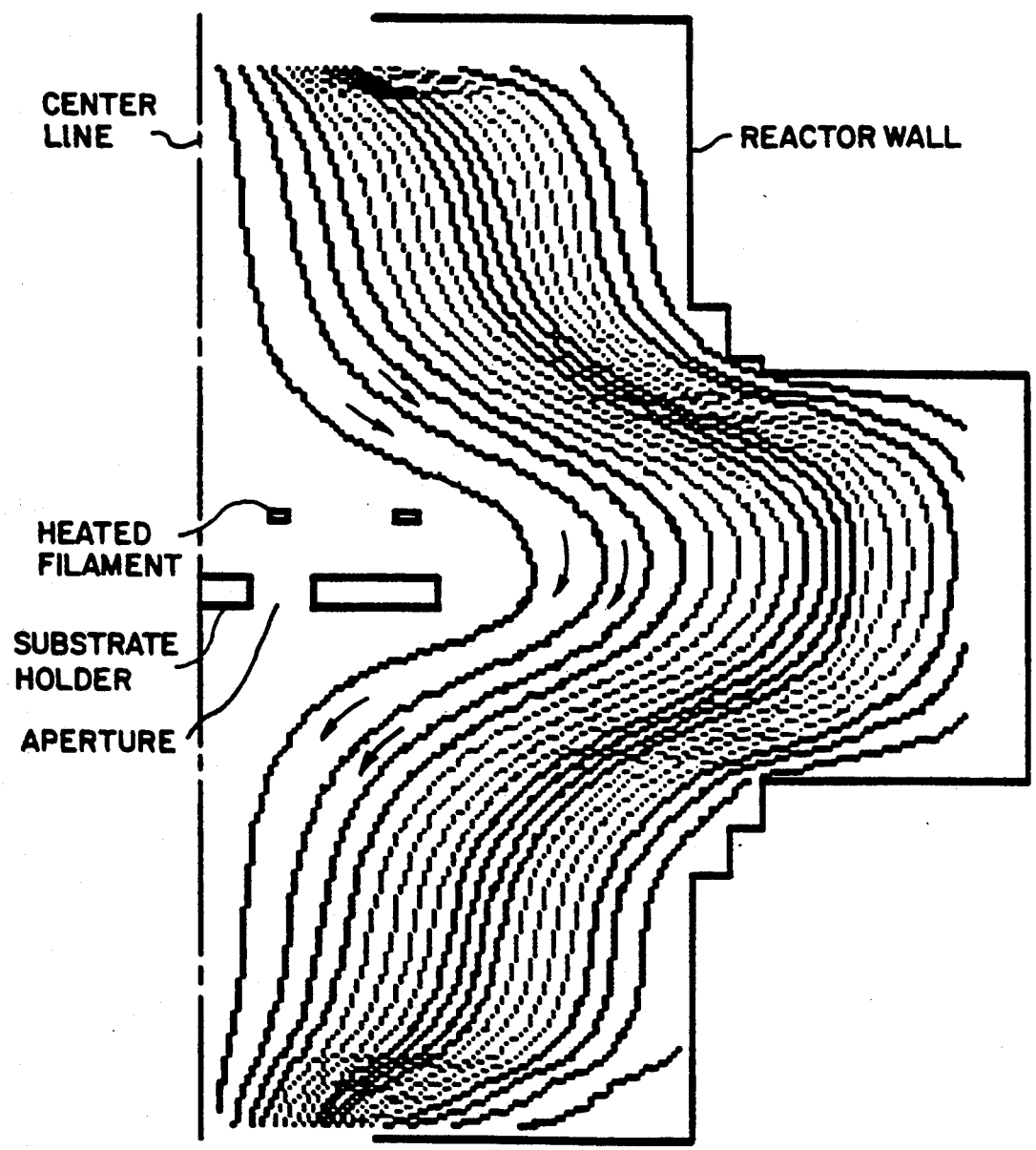
Figure 19:
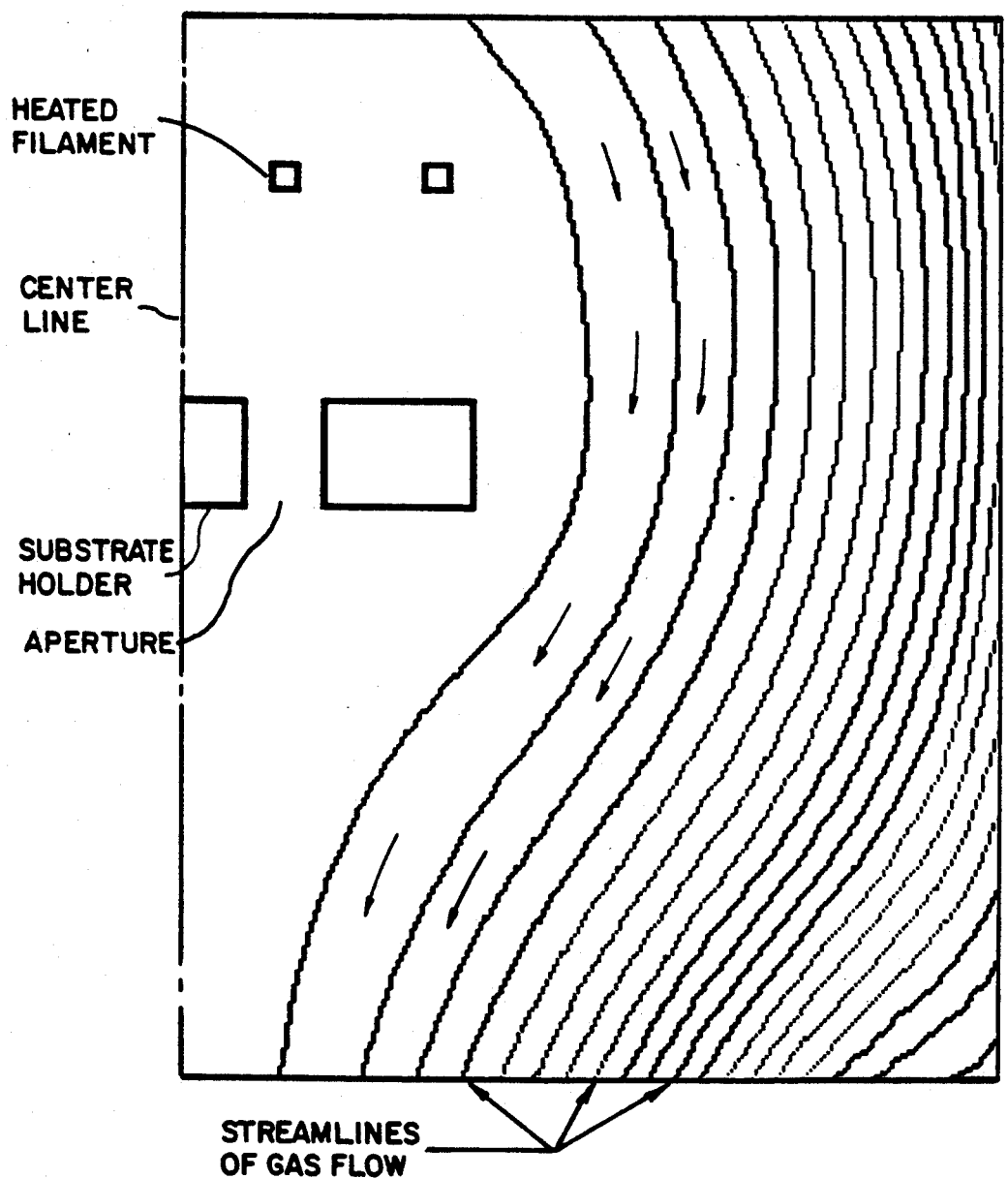

FIGS. 18 and 19 show the streamlines of gas flow predicted for the modified substrate holder. The gas flow is laminar, with the bulk of the inlet gases diverted far upstream of the substrate. Again, the location of the streamlines and the vectors of gas velocity at a large distance from the substrate (e.g. upstream of the filament) are essentially identical to those predicted in Control 1b. This indicates that the presence of the aperture has essentially no effect on the main gas flow through the reactor at this high flow rate.

Figure 20:
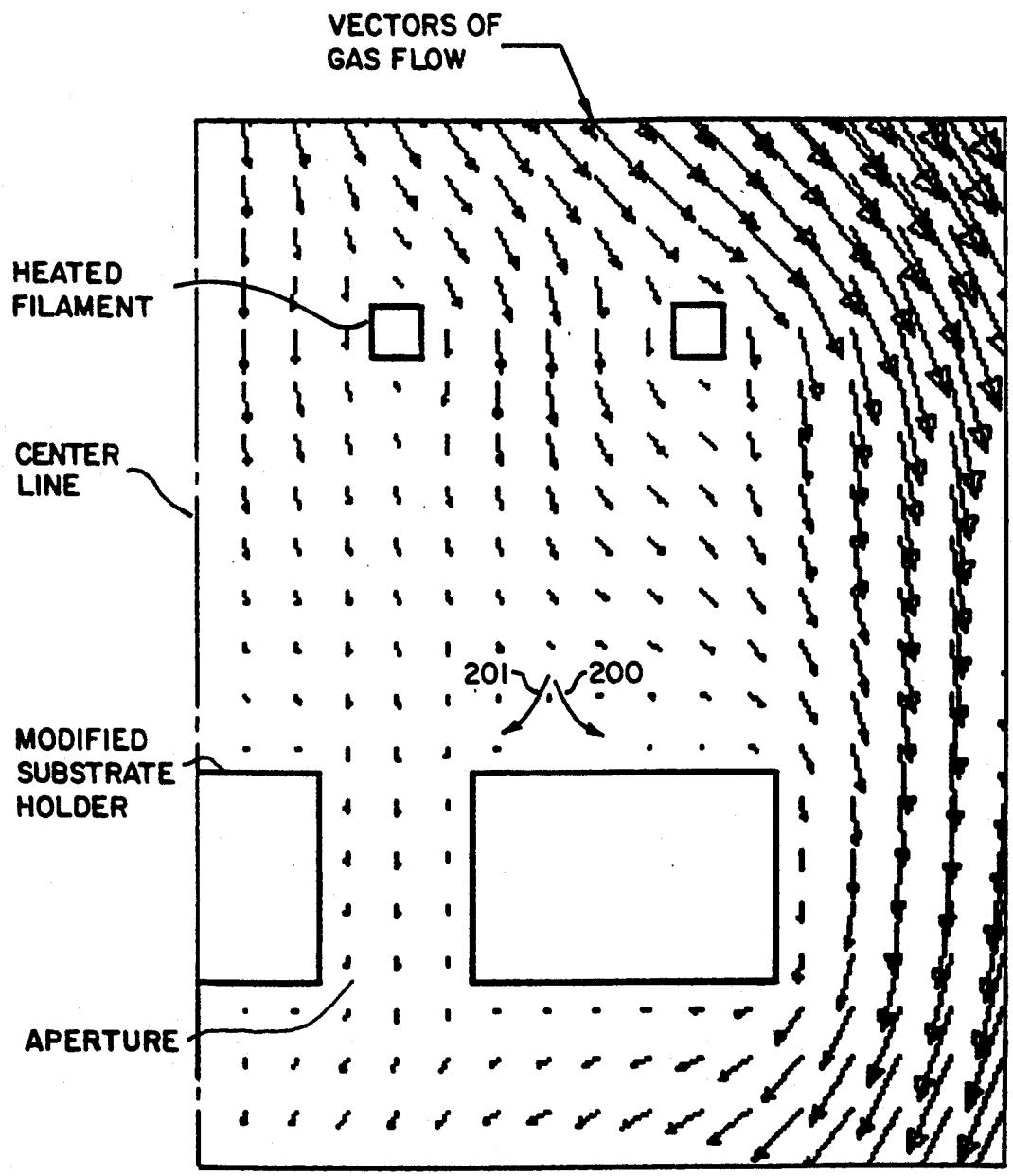

FIG. 20 is a highly magnified representation of the gas flow field adjacent to the substrate, as represented by vectors of the gas velocity at various locations. The presence of the aperture affects the flow in essentially the same way as at low flow rate. Note that once again there is a significant flow through the aperture, as shown by gas velocity vectors inside the aperture. Furthermore, there are two stagnation points of gas flow, one at the center of the substrate and one located between the aperture and the substrate's outer edge. As in FIG. 17 Vectors 200 and 201 indicate the point of divergence of the vectors shown in FIG. 20. Vector 200 shows outward flow toward the edge of the substrate holder. Vector 201 shows inward flow toward the aperture.

Gas flow adjacent to the substrate surface is radial, but the flow path is not continuous from the center of the substrate all the way to the outer edge. Instead, flow is radially inward over that portion of the surface between the outer stagnation point and the aperture. The radial component of gas velocity varies with position in the same way as Example 1 (at lower flow rate), but the maximum radial velocity is $1.1 \times 10^{-3}$ ft/sec., which is consistent with the higher flow rate through the reactor.

The average distance of the radial flow (before the gas rejoins a stream in axial flow) is much shorter than in Control 1b. This corresponds to a smaller contact time, with less opportunity for depletion of reactive species due to deposition of the diamond film. This implies that there will be less radial non-uniformity of coating than at the same flow rates in the absence of the aperture.

EXAMPLE 3

PCD Coating in the Modified HFCVD Reactor—10 SCCM Flow Rate

Two 1.35"×0.387"×0.062" molybdenum heat sinks were placed side by side on the top of a 1.5"×1.5" square substrate holder positioned in the center of a cylindrical ~3" diameter six-way cross, with its flat surface perpendicular to the axis of the reactor. However, the edges of the heat sinks were approximately ~⅛" apart, to expose a slit-shaped aperture in the substrate holder. The substrate holder had a ~⅛" wide and 1.0" long aperture in the center to allow passage of gas through it. A filament made of 1 mm diameter tantalum wire was placed ~10 mm from the heat sinks. The heat sinks were pre-etched with 3 micron diamond paste and deposited with PCD film using 10 SCCM of 0.5% $CH_4$ in hydrogen, 30 torr total pressure, ~2180° C. filament and ~810° C. substrate temperatures for 13 hours. The heat sinks were deposited with ~10 μm thick and uniform PCD films.

This example, therefore, showed the importance of minimizing the distance during which gas flows radially outward parallel to the surface due to stagnation point flow in the HFCVD reactor for depositing uniform coating.

EXAMPLE 4

PCD Coating in the Modified HFCVD Reactor—10 SCCM Flow Rate

The PCD coating experiment described in Example 3 was repeated using an identical reactor design, heat sinks, and surface preparation technique. The heat sinks were deposited with PCD film using 10 SCCM of 1.0% $CH_4$ in $H_2$, 30 torr total pressure, ~2200° C. filament and ~820° C. substrate temperatures for 13 hours. The heat sinks were deposited with a uniform ~10 μm thick PCD film.

EXAMPLE 5

PCD Coating in the Modified HFCVD Reactor—30 SCCM Flow Rate

The PCD experiment described in Example 3 was repeated using an identical reactor design, heat sinks, and surface preparation technique. The heat sinks were deposited with PCD film using 30 SCCM of 1.0% $CH_4$ in $H_2$, 30 torr total pressure, ~2210° C. filament and ~820° C. substrate temperatures for 12 hours. The heat sinks were again deposited with a uniform ~10 μm thick PCD film.

EXAMPLE 6

PCD Coating in the Modified HFCVD Reactor—60 SCCM Flow Rate

The PCD experiment described in Example 3 was repeated using an identical reactor design, heat sinks, and surface preparation technique. The heat sinks were deposited with PCD film using 60 SCCM of 1.0% $CH_4$ in $H_2$, 30 torr total pressure, ~2250° C. filament and ~810° C. substrate temperatures for 12 hours. The heat sinks were again deposited with a uniform ~10 μm thick PCD film.

The foregoing examples have set forth an improved HFCVD reactor which produces substantially uniform coatings on multiple substrates placed on the apertured substrate holder. This is accomplished by modifying the flow of the gas stream in such a manner as to minimize the distance traveled by gas flowing parallel to the substrate surface due to stagnation points of gas flow adjacent to the substrate(s), which is inherent in the typical HFCVD reactors.

While the embodiments of the CVD apparatus and methods have been disclosed with reference to specific structures, one of ordinary skill can make various changes and modifications to the invention to adapt it to various uses and conditions. As such, these changes and modifications are properly, equitably, and intended to be, within the full range of equivalents of the following claims.

What is claimed is:

1. An improved hot filament chemical vapor deposition apparatus for deposition of material on a plurality of substrates comprising:

reactor wall means defining a reactor chamber;

support means for supporting the plurality of substrates within said reactor chamber;

inlet conduit means for introducing reactant gases into said reactor chamber on the upstream side of said support means;

outlet conduit means for extracting said gases from said reactor chamber on the downstream side of said support means;

dispersion means operatively connected to said inlet conduit means;

said dispersion means and said support means defining a reaction zone therebetween; and heater means interposed between said dispersion means and said support means for heating and activating said reactant gases;

said dispersion means having a configuration to introduce reactant gases to said reaction zone with a substantially uniform velocity;

said support means having a configuration and position to substantially reduce stagnation point flow of said reactant gases adjacent to the substrates supported within said reaction zone;

said support means comprising an apertured plate interposed between said dispersion means and said outlet conduit means;

said apertured plate comprising a plurality of uniform apertures configured and positioned in relationship to said dispersion means and heater means to substantially reduce stagnation point flow of said reactant gases adjacent to the substrates; and said support means thereby reducing the radial flow of said gases to provide substantially uniform coating of the substrates.

2. The apparatus of claim 1 wherein said dispersion means comprises:

an apertured housing operatively connected to said inlet conduit means to introduce said reactant gases to said reaction zone with a substantially uniform axial velocity;

said apertured housing comprising a plurality of apertures on the downstream surface of said housing.

3. The apparatus of claim 2 wherein said apertured housing extends transversely in said reactor chamber and is oriented within said reactor chamber such that the apertured surface of said housing is perpendicular to the axis of the gas flow through said reaction zone.

4. The apparatus of claim 1 wherein said heater means comprises:

a filament network of predetermined shape and configuration;

said filament network being comprised of resistively heatable wire.

5. The apparatus of claim 4 wherein the distance between said filament network and the substrate on said support means is in the range of about 3 mm to 20 mm.

6. The apparatus of claim 4 wherein said wire comprises a material selected from the group consisting of tantalum, tungsten, molybdenum, rhenium, and mixtures thereof.

7. The apparatus of claim 4 wherein said filament network comprises:

a composite material having a core of material selected from the group consisting of a ceramic, graphite, carbon fiber and carbon-carbon composite and an outer coating of a material selected from the group consisting of tantalum, tungsten, molybdenum, rhenium, and mixtures thereof.

8. The apparatus of claim 7 wherein the thickness of said coating on said core is in the range of about 10 micron to 2000 microns.

9. The apparatus of claim 7 wherein the diameter of said composite material is in the range of about 1.0 to 3.0 mm.

10. The apparatus of claim 4 wherein the diameter of said wire is in the range of about 0.2 to 1.5 mm.

11. The apparatus of claim 4 wherein said filament network comprises a single continuous wire configured and positioned in said network such that said wire comprises a series of bends lying substantially in a plane parallel to said support means, such that said network extends beyond the outer edge of said support means.

12. The apparatus of claim 4 wherein said filament network comprises multiple wires each of which comprises a series of bends lying substantially in a plane parallel to said support means, such that said wires conduct electric heating current in parallel between electric contacts positioned beyond the outer edge of said support means.

13. The apparatus of claim 4 wherein the cross-sectional area of said filament network is greater than the cross-sectional area of the apertured surface of said dispersion means.

14. The apparatus of claim 4 wherein said filament network extends transversely in said reaction zone and is oriented within said reaction zone such that maximum cross-sectional area of said filament network is perpendicular to the axis of the gas flow through said reaction zone.

15. The apparatus of claim 1 wherein a substrate heater means is operably mounted to the downstream side of said support means to assist in controlling the temperature of the substrate.

16. An improved hot filament chemical vapor deposition apparatus for deposition of material on a plurality of substrates comprising:

reactor wall means defining a reactor chamber;

support means for supporting the plurality of substrates within said reactor chamber;

inlet conduit means for introducing reactant gases into said reactor chamber on the upstream side of said support means;

outlet conduit means for extracting said gases from said reactor chamber on the downstream side of said support means;

dispersion means operatively connected to said inlet conduit means;

said dispersion means and said support means defining a reaction zone therebetween;

heater means interposed between said dispersion means and said support means for heating and activating said reactant gases comprising a filament network of predetermined shape and configuration and comprised of resistively heatable wire;

said dispersion means having a configuration to introduce reactant gases to said reaction zone with a substantially uniform velocity comprising an apertured housing operatively connected to said inlet conduit means to introduce said reactant gases to said reaction zone with a substantially uniform axial velocity;

said apertured housing comprising a plurality of uniform apertures on the downstream surface of said housing and extending transversely in said reactor chamber and oriented within said reactor chamber such that the apertured surface of said housing is perpendicular to the axis of the gas flow through said reaction zone; and said support means having a configuration and position to substantially reduce stagnation point flow of said reactant gases adjacent to the substrates supported within said reaction zone comprising an apertured plate interposed between said dispersion means and said outlet conduit means;

said apertured plate comprising a plurality of apertures configured and positioned to substantially reduce stagnation point flow of said reactant gases adjacent to the substrates thereby reducing the radial flow of said gases to provide substantially uniform coating of the substrates; and substrate heater means operably mounted on the downstream side of said support means for assisting in the control of the temperature of the substrates;

said substrate heater means having apertures axially aligned with said apertures in said apertured plate of said support means.

17. The apparatus of claim 16 wherein the distance between said filament network and the substrate on said support means is in the range of about 3 mm to 20 mm.

18. The apparatus of claim 16 wherein said wire comprises:

a material selected from the group consisting of tantalum, tungsten, molybdenum, rhenium, and mixtures thereof.

19. The apparatus of claim 16 wherein said filament network comprises:

a composite material having a core of material selected from the group consisting of a ceramic, graphite, carbon fiber and carbon-carbon composite and an outer coating of a material selected from the group consisting of tantalum, tungsten, molybdenum, rhenium, and mixtures thereof.

20. The apparatus of claim 19 wherein the thickness of said coating on said core is in the range of about 10 micron to 2000 microns.

21. The apparatus of claim 19 wherein the diameter of said composite material is in the range of about 1.0 to 3.0 mm.

22. The apparatus of claim 16 wherein the diameter of said wire is in the range of about 0.2 to 1.5 mm.

23. The apparatus of claim 16 wherein said filament network comprises a single continuous wire configured and positioned in said network such that said wire comprises a series of bends lying substantially in a plane parallel to said support means, such that said network extends beyond the outer edge of said support means.

24. The apparatus of claim 16 wherein said filament network comprises multiple wires each of which comprises a series of bends lying substantially in a plane parallel to said support means, such that said wires conduct electric heating current in parallel between electric contacts positioned beyond the outer edge of said support means.

25. The apparatus of claim 16 wherein the cross-sectional area of said filament network is greater than the cross-sectional area of said apertured surface of said dispersion means.

26. The apparatus of claim 16 wherein said filament network extends transversely in said reaction zone and is oriented within said reaction zone such that maximum cross-sectional area of said filament network is perpendicular to the axis of the gas flow through said reaction zone.

27. The apparatus of claim 16 wherein said apertured housing contains a finely dispersed, inert solid packing material.

28. The apparatus of claim 16 wherein said apertured housing contains a finely dispersed, inert solid packing material selected from the group consisting of glass wool, stainless steel wool, glass beads, ceramic beads and mixtures thereof supported on the downstream side by a ceramic or stainless steel wire mesh.

* * * * *